US010777438B2

(12) United States Patent
Caveney et al.

(10) Patent No.: US 10,777,438 B2
(45) Date of Patent: Sep. 15, 2020

(54) PROCESSING APPARATUS

(71) Applicant: Brooks Automation, Inc., Chelmsford, MA (US)

(72) Inventors: Robert T. Caveney, Windham, NH (US); Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 487 days.

(21) Appl. No.: 15/103,268

(22) PCT Filed: Oct. 16, 2014

(86) PCT No.: PCT/US2014/060893
§ 371 (c)(1),
(2) Date: Jun. 9, 2016

(87) PCT Pub. No.: WO2015/057959
PCT Pub. Date: Apr. 23, 2015

(65) Prior Publication Data
US 2016/0293467 A1    Oct. 6, 2016

Related U.S. Application Data

(60) Provisional application No. 61/892,849, filed on Oct. 18, 2013, provisional application No. 61/904,908, filed on Nov. 15, 2013.

(51) Int. Cl.
H01L 21/677    (2006.01)
H01L 21/67    (2006.01)

(52) U.S. Cl.
CPC .. H01L 21/67742 (2013.01); H01L 21/67167 (2013.01); H01L 21/67173 (2013.01); H01L 21/67259 (2013.01)

(58) Field of Classification Search
CPC ........ H01L 21/67167; H01L 21/67173; H01L 21/67259; H01L 21/67742
See application file for complete search history.

(56) References Cited

U.S. PATENT DOCUMENTS 8,328,495 B2    12/2012    Bufano et al.
2001/0000048 A1    3/2001    Kato et al.
(Continued)

FOREIGN PATENT DOCUMENTS

JP    10335413    12/1998
JP    2004090186    3/2004
(Continued)

OTHER PUBLICATIONS

International Search Report, International Application No. PCT/US2014/060893, dated Jan. 8, 2015.

Primary Examiner — Saul Rodriguez
Assistant Examiner — Ashley K Romano
(74) Attorney, Agent, or Firm — Perman & Green, LLP; Colin Durham

(57) ABSTRACT

In accordance with one or more aspects of the disclosed embodiment a semiconductor processing apparatus is provided. The semiconductor processing apparatus includes a frame forming a sealable chamber having a longitudinal axis and lateral sides astride the longitudinal axis, the sealable chamber being configured to hold a sealed environment therein, at least one transport module mounted to the sealable chamber and having a telescoping carriage being configured so that the telescoping carriage is linearly movable relative to another portion of the transport module where the telescoping carriage and the other portion define a telescoping motion along the longitudinal axis, and at least one transfer robot mounted to the carriage, each of the at least
(Continued)

one transfer robot having at least one transfer arm configured for holding a substrate thereon.

28 Claims, 25 Drawing Sheets

(56) References Cited

U.S. PATENT DOCUMENTS

| | | |
|---|---|---|
| 2001/0024611 A1 | 9/2001 | Woodruff et al. |
| 2001/0043860 A1 | 11/2001 | Volle |
| 2005/0005849 A1 | 1/2005 | Masuoka |
| 2006/0156979 A1 | 7/2006 | Thakur et al. |
| 2006/0182529 A1 | 8/2006 | Hiroki |
| 2006/0285945 A1* | 12/2006 | Hofmeister ....... H01L 21/67161 414/217 |
| 2011/0280693 A1 | 11/2011 | Hofmeister et al. |
| 2014/0271083 A1* | 9/2014 | Caveney ........... H01L 21/67173 414/749.5 |
| 2015/0010379 A1* | 1/2015 | Sharrock ............... H01L 21/681 414/292 |
| 2015/0206782 A1* | 7/2015 | Caveney .............. B25J 11/0095 414/744.6 |
| 2016/0293467 A1* | 10/2016 | Caveney ........... H01L 21/67173 |

FOREIGN PATENT DOCUMENTS

| | | |
|---|---|---|
| JP | 2004106105 | 4/2004 |
| JP | 2004265947 | 9/2004 |
| JP | 2004349503 | 12/2004 |
| JP | 2005012185 | 1/2005 |
| JP | 2005317656 | 11/2005 |
| JP | 2007012720 | 1/2007 |
| JP | 2011199121 | 10/2011 |

* cited by examiner

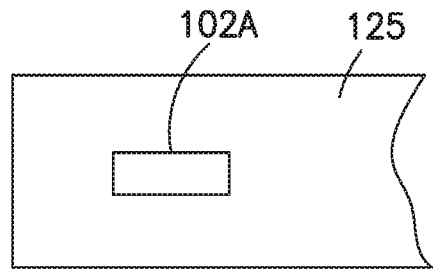
FIG.1D
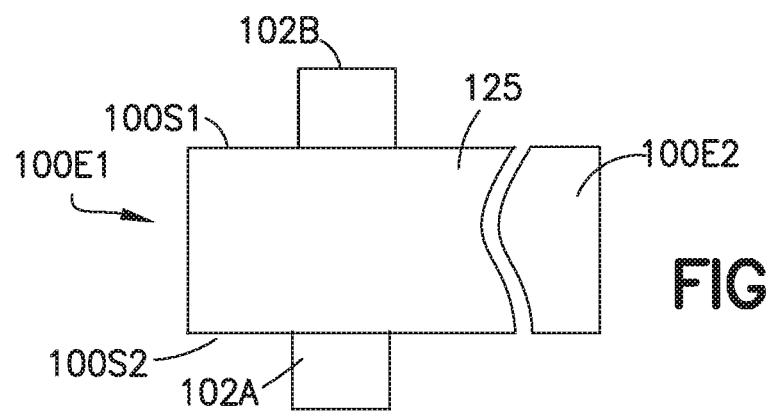
FIG.1E
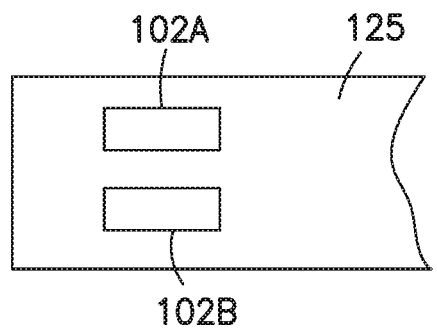
FID.1F
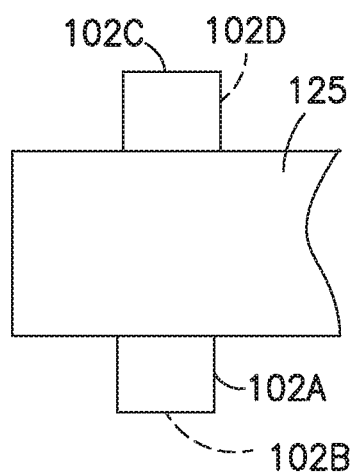
FIG.1G

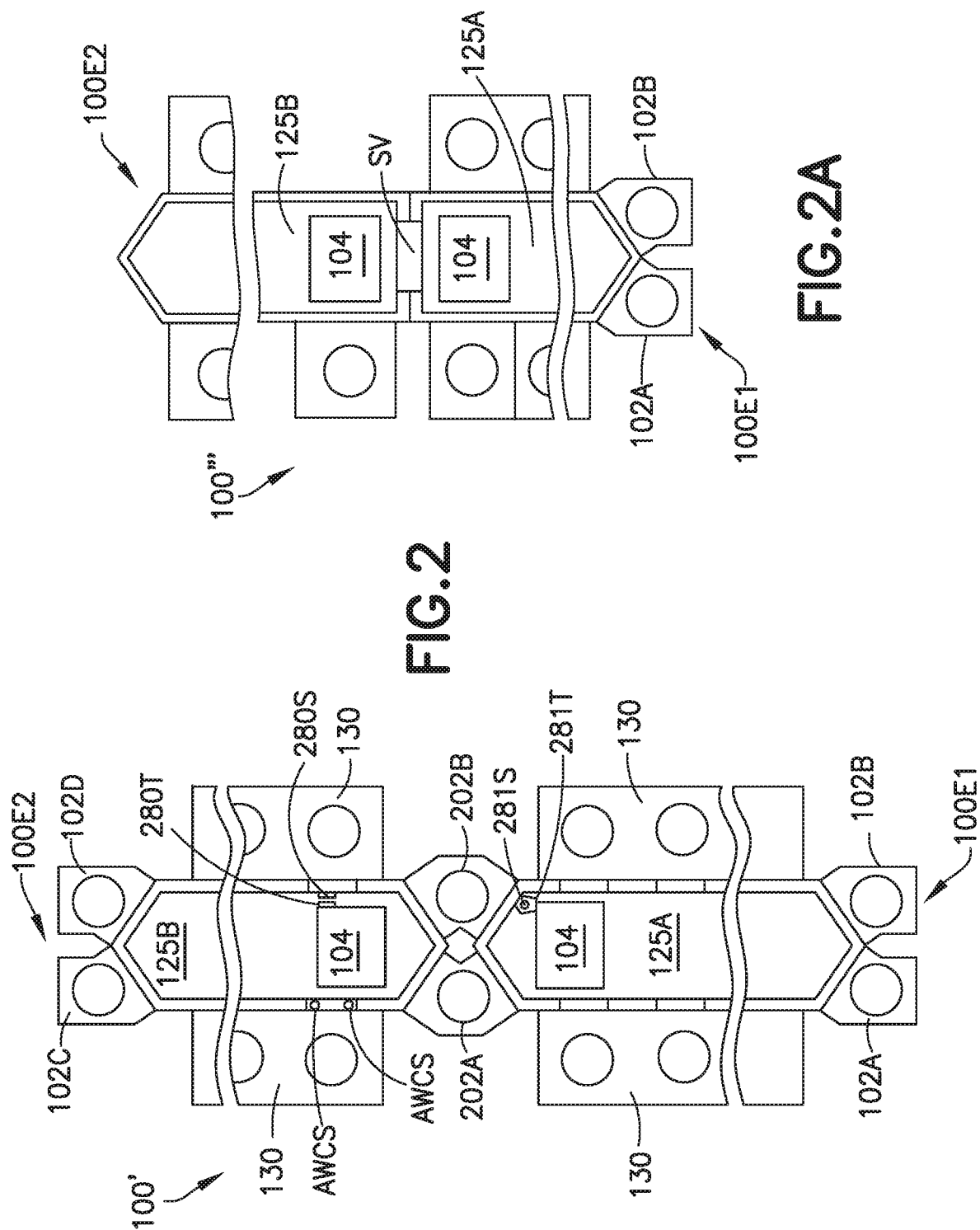

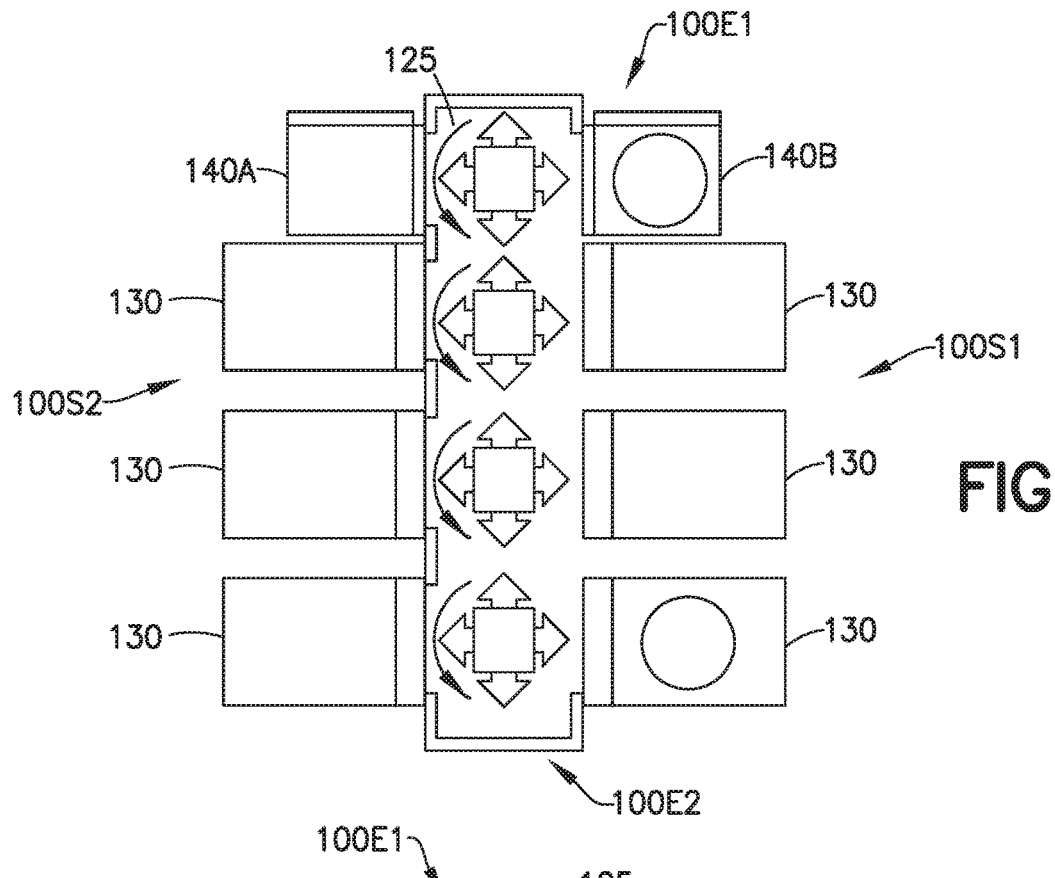
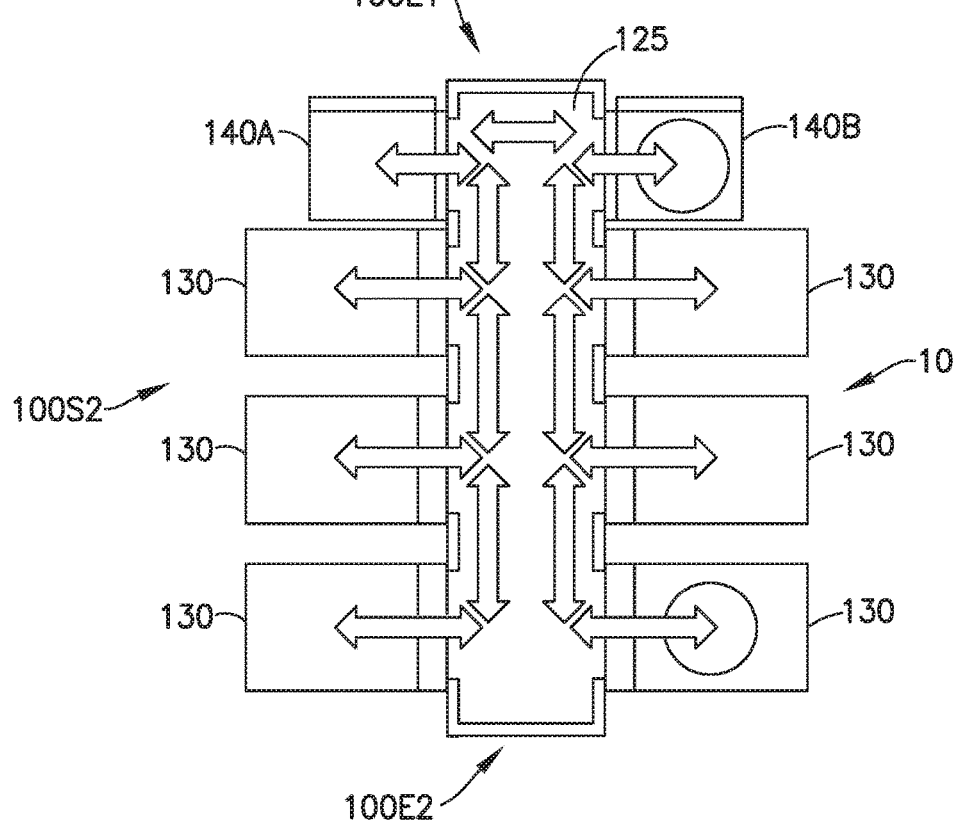

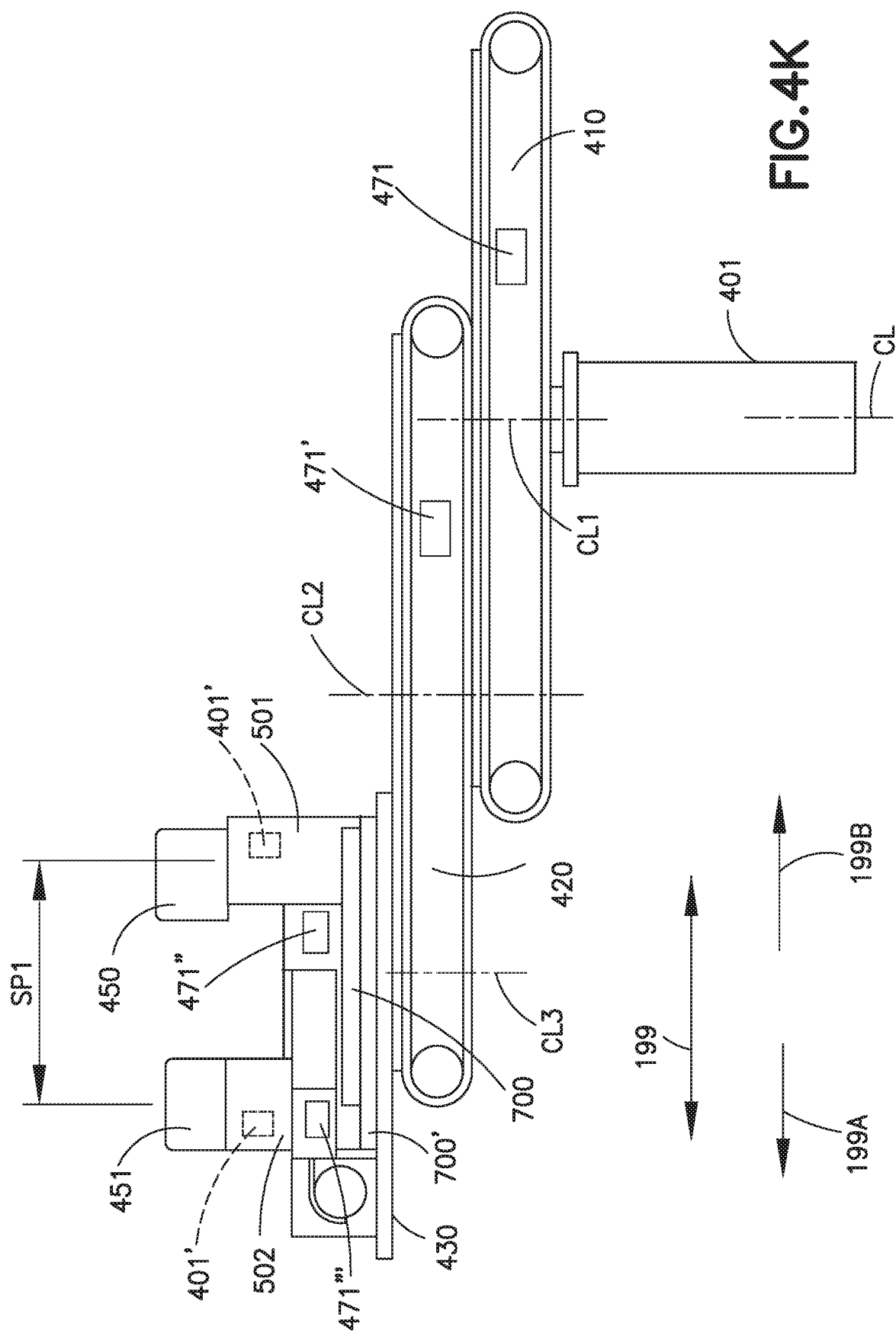

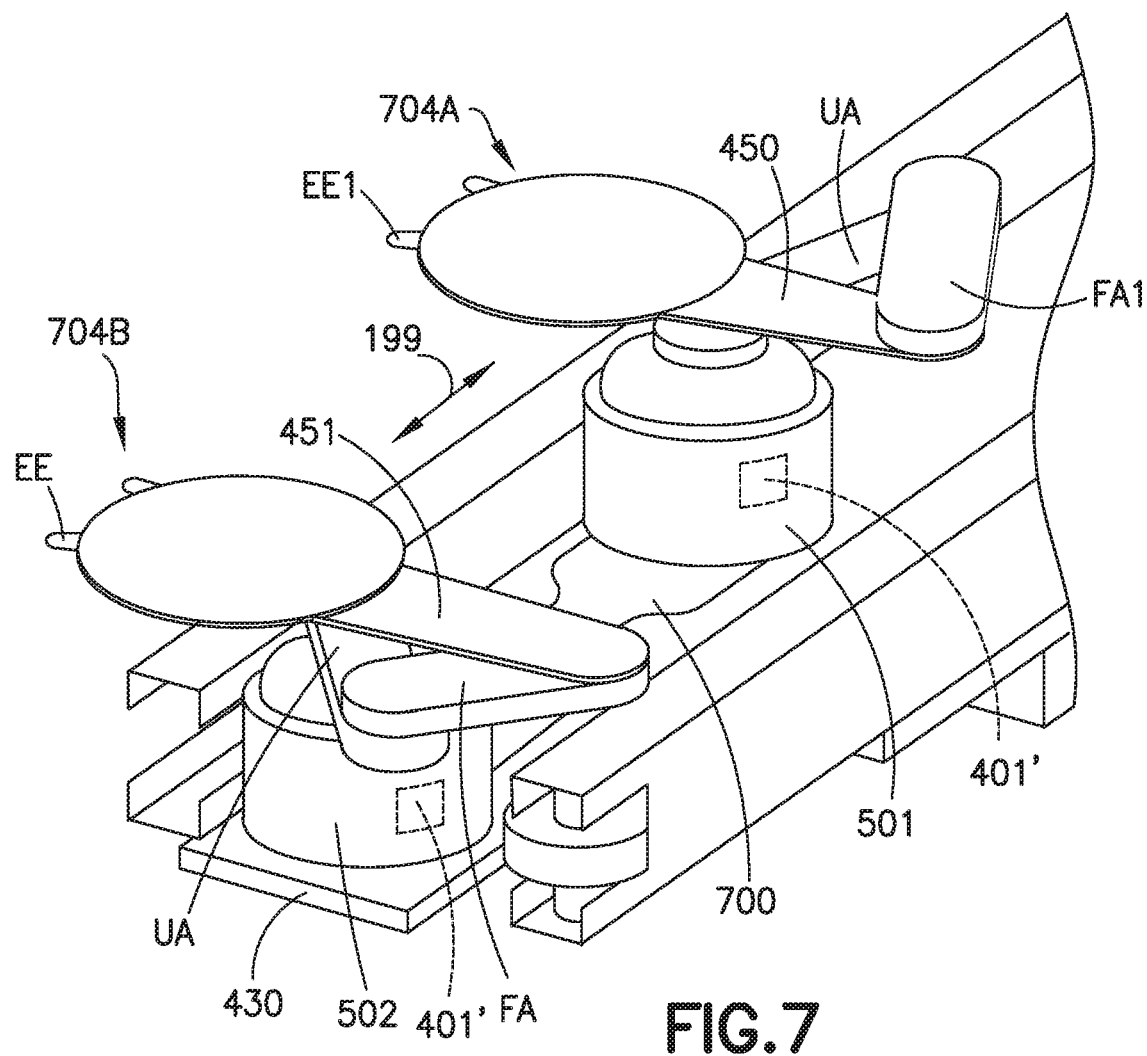
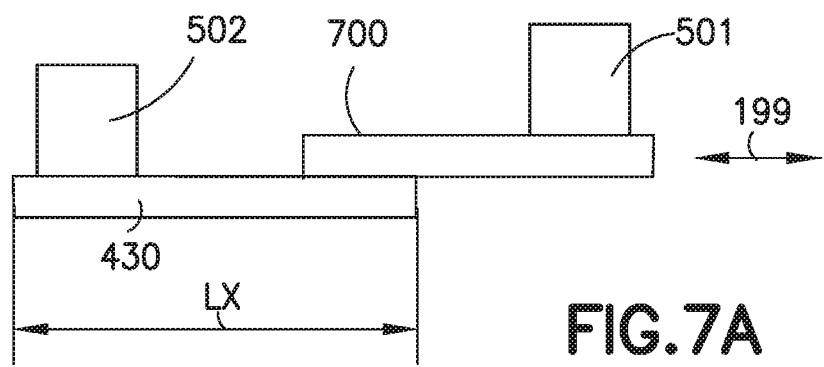

PROCESSING APPARATUS

CROSS REFERENCE TO RELATED APPLICATIONS

This application is the National Stage of International Application No. PCT/US2014/06083, having an International Filing Date of 16 Oct. 2014, which designated the United States of America, and which International Application was published under PCT Article 21(2) as WO Publication No. 2015/057959, which claims priority from, and the benefit of U.S. Provisional Patent Application No. 61/892,849 filed on Oct. 18, 2013 and U.S. Provisional Patent Application No. 61/904,908 filed on Nov. 15, 2013, the disclosures of which are incorporated herein by reference in their entireties.

BACKGROUND

1. Field

The exemplary embodiments generally relate to processing apparatus and, more particularly, to processing apparatus having substrate transport systems.

2. Brief Description of Related Developments

Generally, semiconductor processing systems having narrow elongated transport systems that support multiple in-line process tool arrays are desired by semiconductor manufacturers. These narrow elongated transport systems may improve packaging density of the integrated processing tool system. In some aspects, linear automation solutions were embedded as part of the transport chamber where the linear bearing or levitation mechanism relied on the chamber for mounting and stiffness of the automation components. In other aspects, such as in tandem cluster tool formats, multiple robots would hand off substrates to and/or from each other to move the substrates along a predetermined processing sequence of the substrate processing tool. As may be realized multiple touches of the substrates are performed in the tandem cluster tool formats while moving the substrate through the transport chamber of the tool and may lead to bottlenecks in wafer throughput and contamination generated from increased wafer contact.

Linear substrate processing tools may also be subjected to size constraints with respect to the shipping and installation of the processing tool components, such as the transport chamber portion(s). In the case of levitation or magnetically coupled transport systems, the ability to machine the transport chambers for the thin walled gap requirements for motor coupling may not be advantageous as the transport chamber lengths reach 3 m and longer and may preclude the ability to join two chambers together while maintaining a vacuum with the sealed thin wall barrier.

It would be advantageous to have a processing system that provides a modular vacuum automation system configured in a linear, narrow tool format, reduces the number of substrate touches, provides a transport apparatus that is capable of interacting independently with parallel, twin processing module configurations or single process modules, provides a transport apparatus capable of interacting with load locks that are arranged stacked one above the other, side by side or angled relative to one another and/or provide a modular transport apparatus that is then installed into a transport chamber as a module fitting within SEMI (Semiconductor Equipment and Materials International) standard E72 guidelines.

BRIEF DESCRIPTION OF THE DRAWINGS

The foregoing aspects and other features of the disclosed embodiment are explained in the following description, taken in connection with the accompanying drawings, wherein:

FIGS. 1B-1G are schematic illustrations of portions of a substrate processing apparatus in accordance with aspects of the disclosed embodiment;

FIG. 2 is a schematic illustration of a substrate processing apparatus in accordance with aspects of the disclosed embodiment;

FIG. 2A is a schematic illustration of a substrate processing apparatus in accordance with aspects of the disclosed embodiment;

FIGS. 3A and 3B are schematic illustrations of a substrate processing apparatus in accordance with aspects of the disclosed embodiment;

FIGS. 4A-4M are schematic illustrations of portions of a substrate processing apparatus in accordance with aspects of the disclosed embodiment;

FIGS. 7, 7A and 7B are schematic illustrations of portions of a substrate processing apparatus in accordance with aspects of the disclosed embodiment;

DETAILED DESCRIPTION

Figure 1:
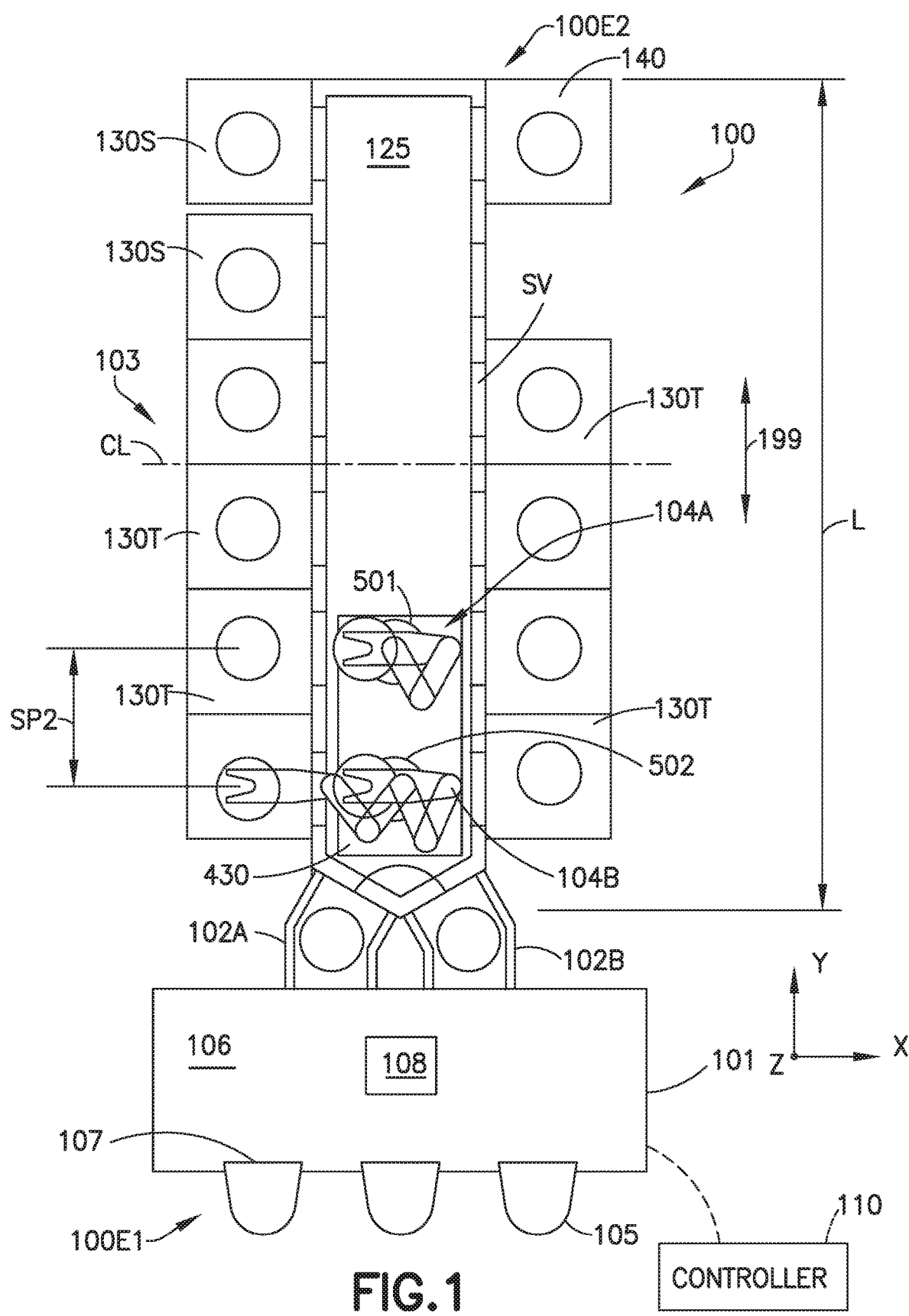
FIG. 1 is a schematic illustration of a substrate processing apparatus in accordance with aspects of the disclosed embodiment.

FIG. 1 is a schematic illustration of a processing apparatus in accordance with an aspect of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

Figure 1A:
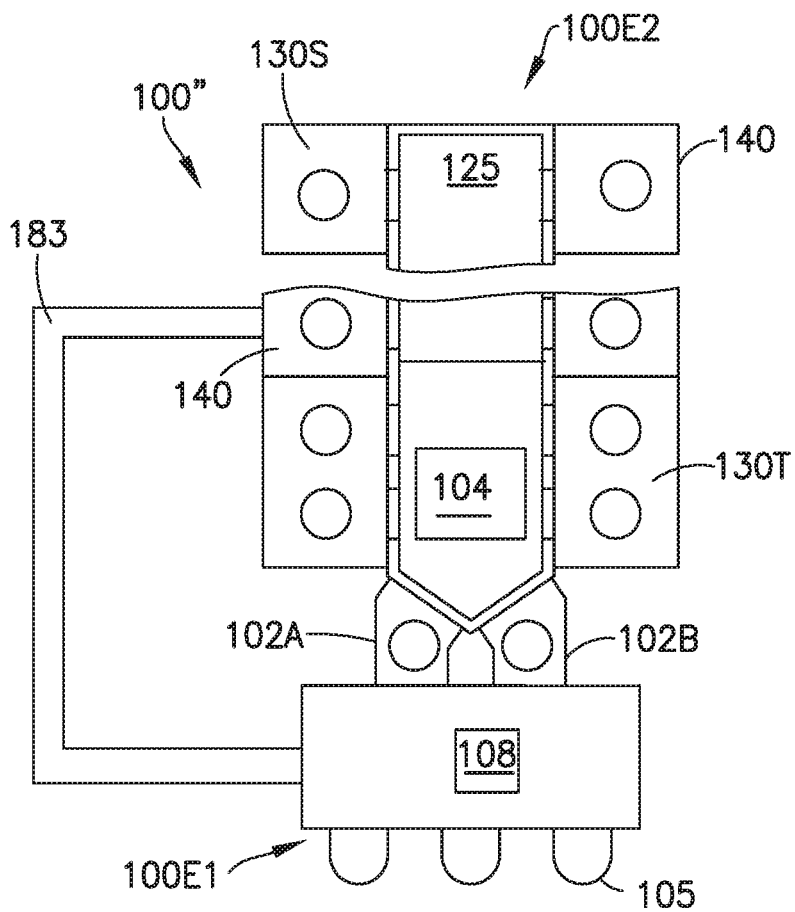
FIG. 1A is a schematic illustration of a substrate processing apparatus in accordance with aspects of the disclosed embodiment.
Figure 1B:
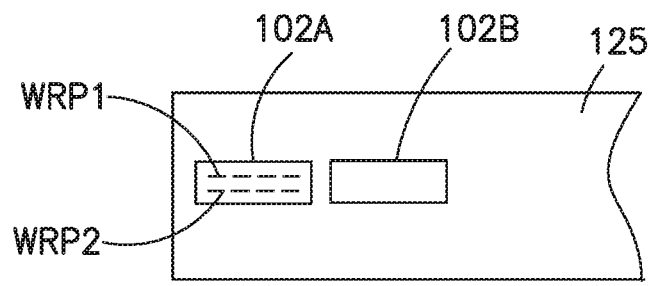
Figure 1C:
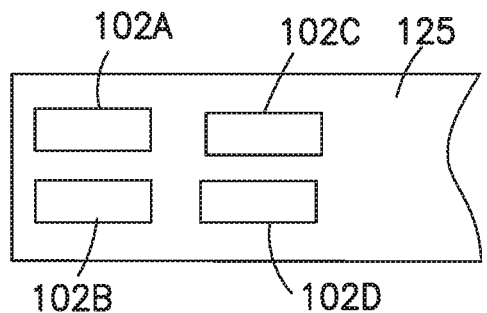

The processing apparatus 100, such as for example a semiconductor tool station, is shown in accordance with an aspect of the disclosed embodiment. Although a semiconductor tool station is shown in the drawings, the aspects of the disclosed embodiment described herein can be applied to any tool station or application employing robotic manipulators. In this example the processing apparatus 100 is shown as a linearly arranged tool, however the aspects of the disclosed embodiment may be applied to any suitable tool station. The apparatus 100 generally includes an atmospheric front end 101, at least one vacuum load lock 102A, 102B and a vacuum back end 103. The at least one vacuum load lock may be coupled to any suitable port(s) or opening (s) of the front end 101 and/or back end 130 in any suitable arrangement. For example, in one aspect the one or more load locks 102A, 102B may be arranged in a common horizontal plane in a side by side arrangement as can be seen in FIG. 1B. In other aspects the one or more load locks may be arranged in a grid format such that at least two load locks 102A, 102B, 102C, 102D are arranged in rows (e.g. having spaced apart horizontal planes) and columns (e.g. having spaced apart vertical planes). In still other aspects the one or more load lock may be a single in-line load lock 102A, 102B as shown in FIGS. 1D and 1E. In yet another aspect the at least one load lock 102A, 102B, 102C, 102D may be arranged in a stacked in-line arrangement as shown in FIGS. 1F and 1G. It should be understood that while load locks are illustrated on two lateral sides 100S1, 100S2 of a transport chamber 125 in other aspects the one or more load lock may be arranged on a single lateral side or on one or more ends 100E1, 100E2 of the transport chamber 125. Each of the at least one load lock may also include one or more wafer/substrate resting planes WRP in which substrates are held on suitable supports within the respective load lock. In other aspects, the tool station may have any suitable configuration. The components of each of the front end 101, the at least one load lock 102A, 102B and back end 103 may be connected to a controller 110 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although three load port modules 105 are shown in FIG. 1, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates between the substrate cassettes and the mini-environment 106. The mini-environment 106 generally includes any suitable transfer robot 108 which may incorporate one or more aspects of the disclosed embodiment described herein. In one aspect the robot 108 may be a track mounted robot such as that described in, for example, U.S. Pat. No. 6,002,840 issued on Dec. 14, 1999, U.S. Pat. No. 8,419,341 issued Apr. 16, 2013, and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

Figure 1H:
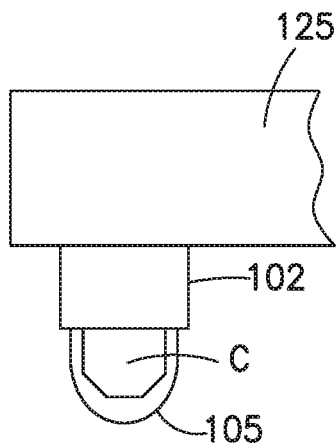
FIGS. 1H and 1I are schematic illustrations of portions of a substrate processing apparatus in accordance with aspects of the disclosed embodiment.
Figure 1I:
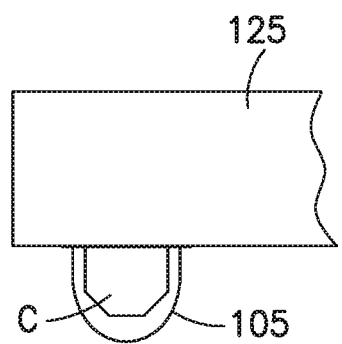

The at least one vacuum load lock 102A, 102B may be located between and connected to the mini-environment 106 and the back end 103. In other aspects the load ports 105 may be coupled substantially directly to the at least one load lock 102A, 102B or the transport chamber 125 (see FIGS. 1H and 1I) where the substrate carrier C is pumped down to a vacuum of the processing chamber 125 and substrates are transferred directly between the substrate carrier C and the load lock or processing chamber. In this aspect, the substrate carrier C may function as a load lock such that a processing vacuum of the transport chamber extends into the substrate carrier C. As may be realized, where the substrate carrier C is coupled substantially directly to the load lock through a suitable load port any suitable transfer apparatus may be provided within the load lock for transferring substrate to and from the substrate carrier C. It is noted that the term vacuum as used herein may denote a high vacuum such as $10^{-5}$ Torr or below in which the substrates are processed. The at least one load lock 102A, 102B generally includes atmospheric and vacuum slot valves. The slot valves of the load locks 102A, 102B (as well as for the processing stations 130) may provide the environmental isolation employed to evacuate the load lock after loading a substrate from the atmospheric front end and to maintain the vacuum in the transport chamber when venting the lock with an inert gas such as nitrogen. As will be described herein, the slot valves of the processing apparatus 100 may be located in the same plane, different vertically stacked planes or a combination of slot valves located in the same plane and slot valves located in different vertically stacked planes to accommodate transfer of substrates to and from at least the processing stations 130 and load locks 102A, 102B coupled to the transport chamber 125. The at least one load lock 102A, 102B may also include an aligner for aligning a fiducial of the substrate to a desired position for processing or any other suitable substrate metrology equipment. In other aspects, the vacuum load lock may be located in any suitable location of the processing apparatus and have any suitable configuration.

The vacuum back end 103 generally includes a transport chamber 125, one or more processing station(s) 130S, 130T (generally referred to herein as processing station(s) 130) and any suitable transfer unit module or transport module 104 that includes one or more transfer robot 104A, 104B which may include one or more aspects of the disclosed embodiments described herein. The transport chamber 125 may have any suitable length L such as a length that complies with SEMI standard E72 guidelines. While two transfer robots 104A, 104B having at least one transfer arm are illustrated in FIG. 1 it should be understood that more or less than two transfer robots having any suitable number of transfer arms may be located within the transport chamber 125. The transfer unit module 104 and the one or more transfer robot 104A, 104B will be described below and may be located within the transport chamber 125 to transport substrates between the load lock 102A, 102B (or between a cassette located at a load port) and the various processing stations 130. In one aspect the transfer unit module 104 may be removable from the transport chamber 125 as modular unit such that the transfer unit module 104 complies with SEMI standard E72 guidelines. The processing stations 130 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 130 are communicably connected to the transport chamber 125 in any suitable manner, such as through slot valves SV, to allow substrates to be passed from the transport chamber 125 to the processing stations 130 and vice versa. The slot valves SV of the transport chamber 125 may be arranged to allow for the connection of twin process stations 130T (e.g. more than one substrate processing chamber located within a common housing), single process stations 130S and/or stacked process modules/load locks (as will be described below).

As can also be seen in FIG. 1, the back end 103 may also include one or more slot valves SV to allow for the connection of a load lock 140 for transferring substrates from or to the transport chamber 125. As may be realized, in one aspect the inclusion of the load lock 140 in the back end 103 allows for substrates to enter the processing apparatus 100 through the front end 101 and exit the processing apparatus 100 through the back end. In other aspects, the load lock 140 may allow substrates to enter the processing apparatus through the back end 103 and exit through the front end 101. In still other aspects substrates may enter and exit the processing apparatus from either or both of the front end or/and the back end (or at any point between ends of the transport chamber 125 as will be described below).

Referring now to FIG. 2 a processing apparatus 100', substantially similar to processing apparatus 100 (e.g. except where noted) is illustrated. In this aspect multiple transport chambers 125A, 125B may be coupled to each other to form the processing apparatus 100' which has any suitable combined/assembled length such that each transport chamber module forming the processing apparatus 100' has a length L (see FIG. 1) that complies with SEMI standard E72 guidelines. Here the transport chambers 125A, 125B are coupled to each other through at least one load lock 202A, 202B to allow module to module substrate handoff. In one aspect the load locks 202A, 202B may allow each transport chamber 125A, 125B to have an internal environment that is different than the other transport chamber(s) 125A, 125B. In other aspects the transport chambers 125A, 125B may have substantially the same internal atmosphere. As may be realized, each transport chamber includes load locks 102A-102D for transferring substrates to and from the processing apparatus 100' so that substrate may enter/exit the processing apparatus 100' through either end 100E1, 100E2 of the processing apparatus 100'. In other aspects, referring also to FIG. 1A, any suitable load lock (such as load locks 202A, 202B, 140) may be located between the ends 100E1, 100E2 (see also FIGS. 1 and 1A) to provide a mid-entry/exit point for substrates to enter and exit the processing apparatus 100, 100', 100". In one aspect a substrate transport tunnel 183 (e.g. return tunnel) that is separate and distinct from the transport chamber 125 may communicably couple the mid-entry/exit point to, for example, a front end 101 or other suitable substrate loading station of the processing apparatus. The substrate transport tunnel 183 may provide substantially uninterrupted substrate passage between, for example, the mid entry/exit station and the front end or other suitable substrate holding station. In one aspect the substrate transport tunnel 183 may be located in substantially the same horizontal plane as the transport chamber 125 while in other aspects the substrate transport tunnel 183 may be located in a plane that is vertically spaced from (e.g. above or below) a plane in which the transport chamber 125 is located. The mid-entry/exit modules and substrate transport tunnels (e.g. return tunnels) may be substantially similar to those described in U.S. Pat. No. 7,959,403 issued Jun. 14, 2011 the disclosure of which is incorporated herein by reference in its entirety. Referring also to FIG. 2A, another processing apparatus 100''' is illustrated in accordance with aspects of the disclosed embodiment. Here the transport chambers 125A, 125B may be communicably coupled so that a transfer unit module 104 of one transport chamber 125A may substantially directly handoff substrates to a transfer unit module 104 of another transport chamber 125B such as through a slot valve or other suitable opening connecting the transport chambers 125A, 125B. In the aspect shown in FIG. 2A the transport chambers 125A, 125B are coupled to each other substantially directly through any suitable opening or slot valve SV but in other aspects any suitable load lock or other substrate holding station may be located between the transport chambers 125A, 125B. As may be realized each transport chamber 125 may have an internal environment different from other transport chambers or one or more transport chambers may share an internal environment.

Referring now to FIGS. 3A and 3B a processing apparatus 100" substantially similar to processing apparatus 100 (e.g. except where noted) is illustrated in accordance with another aspect of the disclosed embodiment. In this aspect the load locks 140 (or load ports for connecting substrate carriers substantially directly to the transport chamber) are located only on the lateral sides 100S1, 100S2 of the transport chamber 125. However, it should be understood that in other aspects the load locks 140 (or load ports) may be located on the ends 100E1, 100E2 and/or the lateral sides 100S1, 100S2 as described above with respect to FIG. 1. As may be realized, the process flow through the processing apparatus 100, 100', 100" described herein may be any suitable process flow such as, for example, illustrated in FIGS. 3A, and 3B. In one aspect substrates may enter the transport chamber 125 through one of the load locks 140A, 140B. In one aspect one load lock 140A, 140B may be an entry load lock and the other load lock 140A, 140B may be an exit load lock so that substrates enter the processing apparatus through one load lock and exit through the other load lock. In other aspects the load locks 140A, 140B may be both entry and exit load locks so that substrates can enter or exit either load lock. As can be seen in FIGS. 3A and 3B, in one aspect the transfer unit module 104 described herein may be configured to substantially simultaneously transfer substrates to opposing processing stations 130 (e.g. on either side 100S1, 100S2 of the transport chamber 125) for processing and/or substantially simultaneously transfer substrates to side by side processing stations 130 (e.g. located on the same side 100S1, 100S2 of the transport chamber 125) and/or provide a fast swapping of substrates at a single processing station (e.g. pick a substrate from the processing station and place another substrate to the processing station in rapid succession while a base of the transport robot remains substantially stationary). In one aspect, as can be seen in FIG. 3A, the substrates may be processed through one or more processing stations 130 in any suitable order such that the substrate can be swapped at any suitable processing station 130. In another aspect, as illustrated in FIG. 3B the substrates may be processed in any suitable order that may be defined by a location of the entry and/or exit load lock 140A, 140B.

Figure 4A:
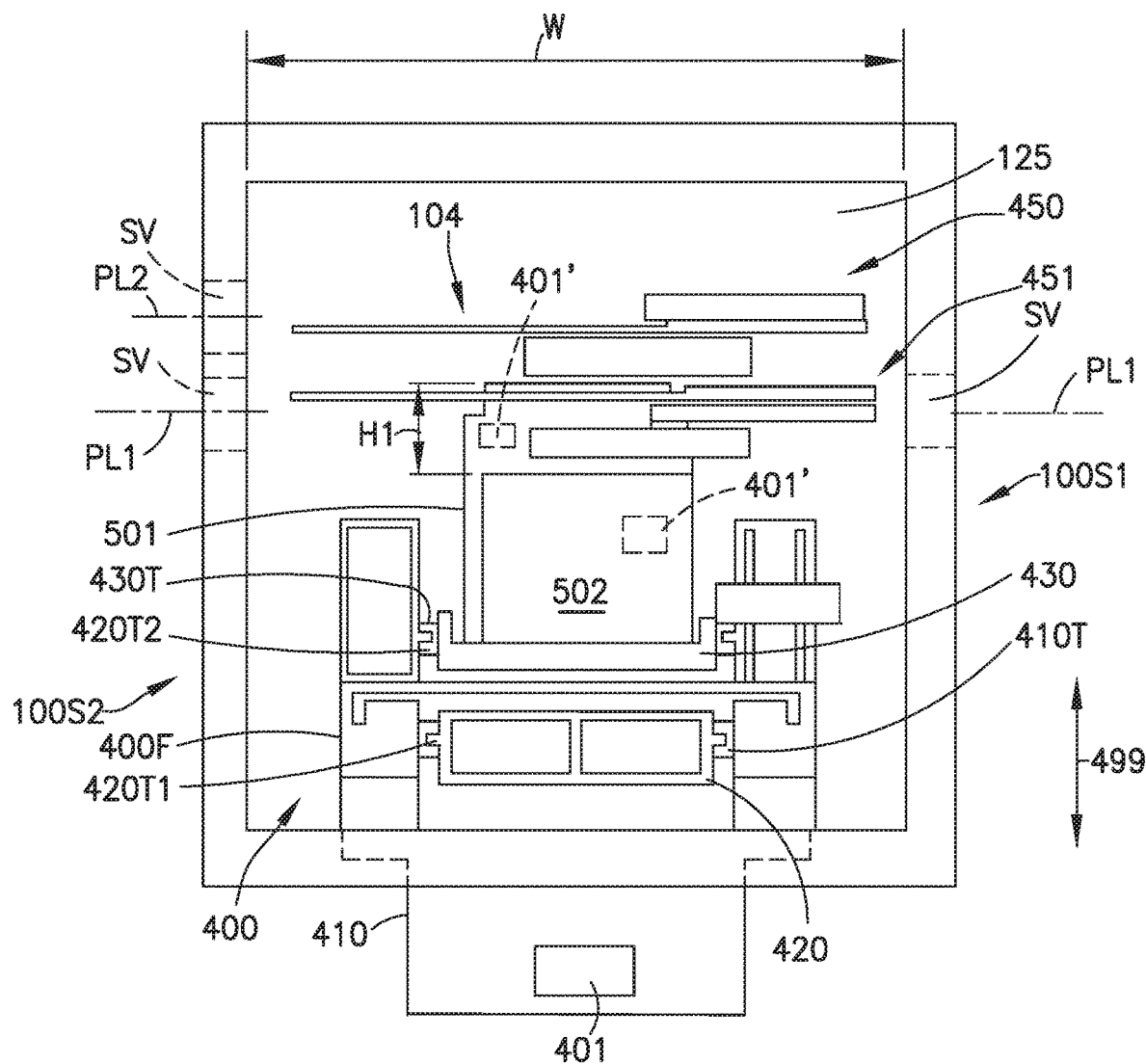
Figure 4B:
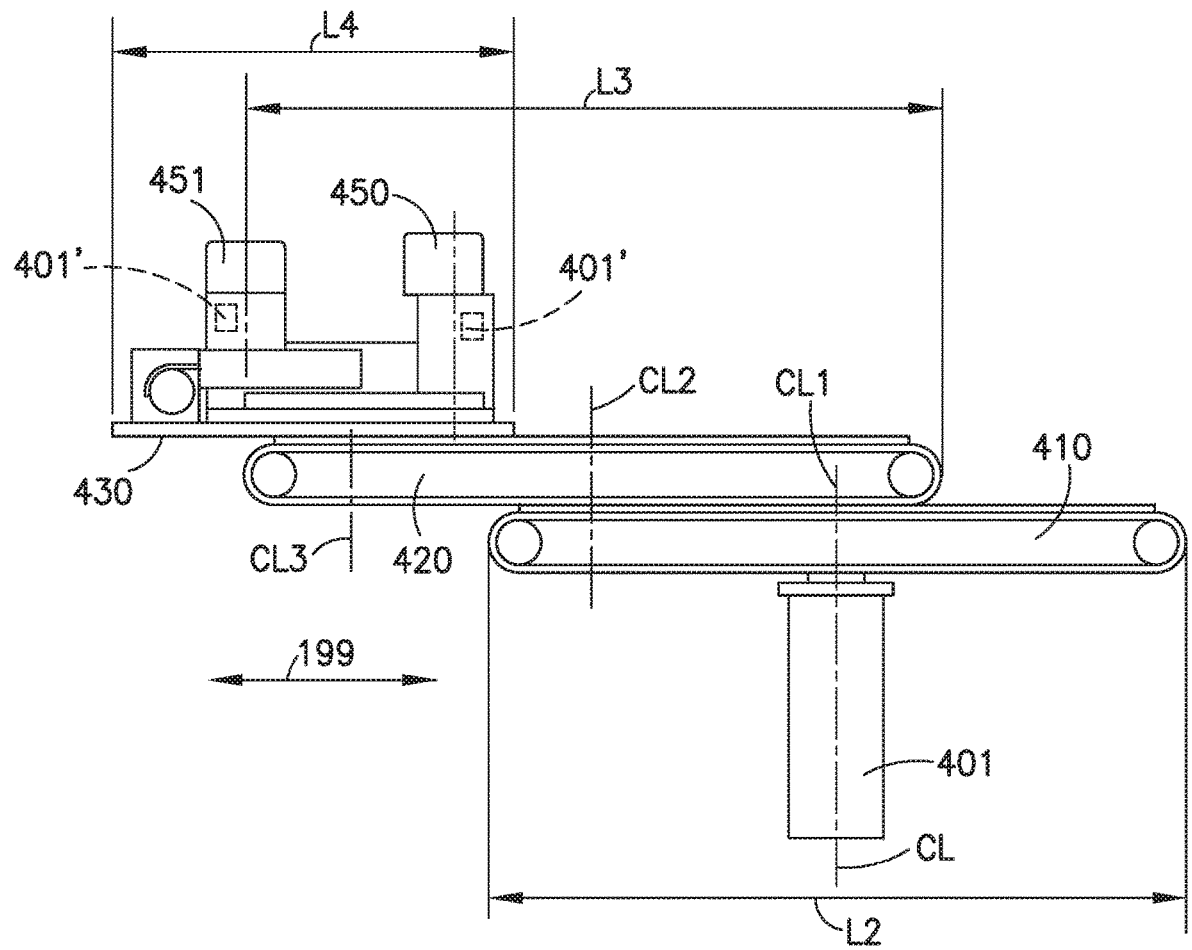
Figure 4C:
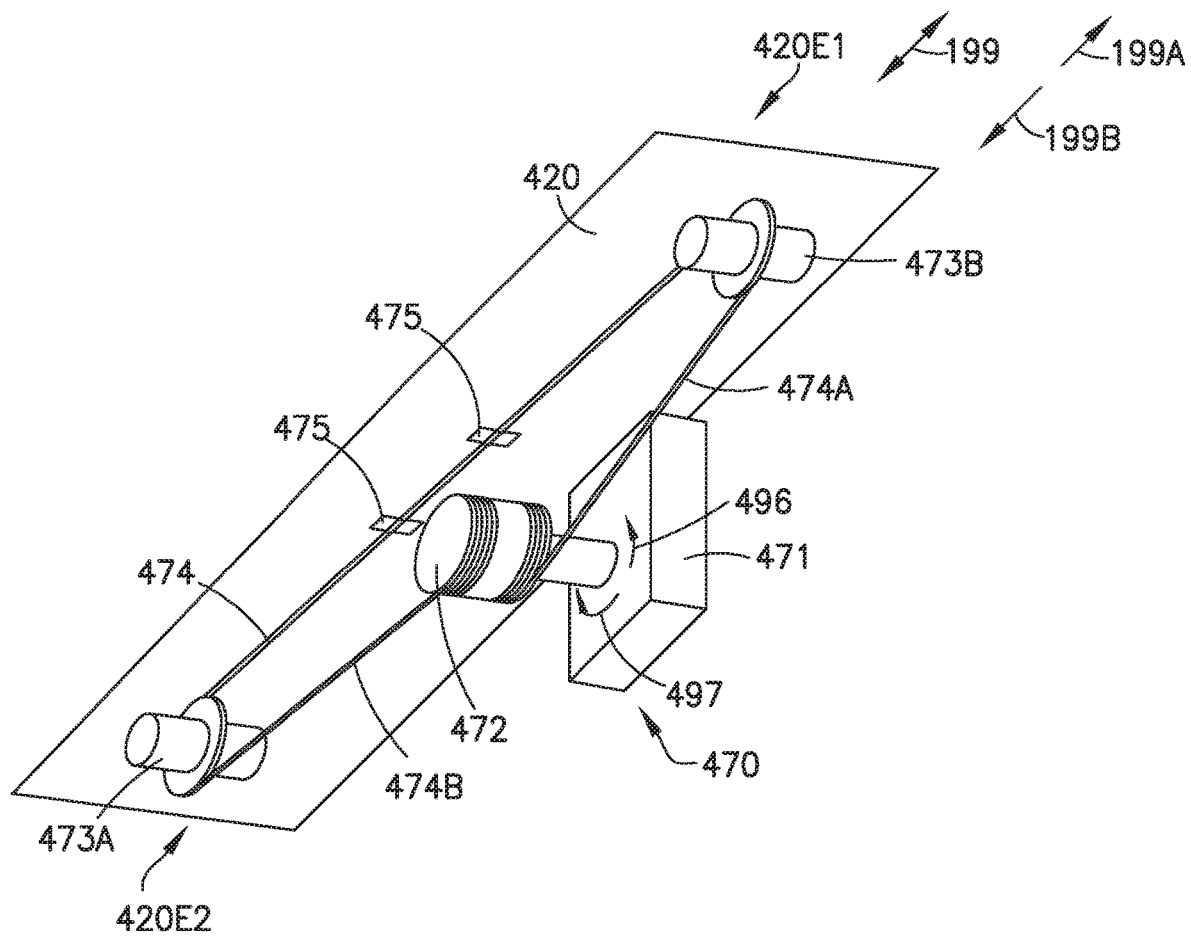

Referring now to FIGS. 4A-4C the transfer unit module 104 may include a telescoping linear traversing mechanism or carriage 400 having a carriage frame 400F to which the components of the telescoping linear traversing mechanism 400 are mounted. As noted above, the telescoping linear traversing mechanism 400 may be a modular unit that allows the linear traversal aspect of the transfer unit module 104 to contract into a smaller package during installation, so as to comply with SEMI standard E72 guidelines as noted above, and provide any desired travel that allows the transfer arm(s) 450, 451 or robot(s) of the transfer unit module 104 to access each process station 130 and load lock/load port coupled to the transport chamber 125. The telescoping linear traversing mechanism 400 may include any suitable drive section which may include a Z-axis lift drive and one or more extension/retraction drives. The drive section of the telescoping linear traversing mechanism 400 may be substantially uncoupled from or not closely coupled to a drive section of the transfer arms (described below) carried by the telescoping linear traversing mechanism 400 which may allow for substantially independent kinematic operation of the telescoping linear traversing mechanism 400 and the transfer arm drives. In one aspect the telescoping linear traversing mechanism 400 may be mounted to a lift (e.g. of Z-axis lift drive 401) that may move the telescoping linear traversing mechanism 400 (and the robot arms mounted thereto) as a unit in the direction of arrow 499 to any suitable desired height for allowing substrate transfer through the slot valves SV of the transport chamber 125. The Z-axis lift drive 401 may be located in a fixed position (e.g. the drive may not move in X and y directions—see FIG. 1) at least partly within the transport chamber 125 (in other aspects the Z-axis drive may not be located within the transport chamber and or be movable in one or more of the X and Y directions). The Z-axis lift drive 401 may be any suitable drive including, but not limited to, ball-screw lift drives, scissor lift drives, hydraulic actuators, pneumatic actuators and magnetic actuators. As may be realized any suitable seal may be provided to isolate the Z-axis lift drive 401 from an internal environment of the transport chamber 125. In other aspects, the transfer unit module 104 may not have any Z-axis movement capability. In still other aspects, each transfer arm, or at least one of either transfer arm, of the transfer unit module 104 may have a respective Z-axis drive 401' for independently moving a respective robot arm in the direction of arrow 499 independent of Z-axis movement of other transfer arms of the transfer unit module 104. This independent and dedicated Z-axis drive(s) 401' for at least one or for each transfer arm 450, 451 may be provided in combination with the collective Z-axis drive 401 (or the collective Z-axis drive may not be provided).

The telescoping linear traversing mechanism 400 may be centrally mounted within the transport chamber 125 such as along a transport chamber centerline CL (FIG. 1) and be configured for bi-directional extension (e.g. capable of extension on either side of the transport chamber centerline CL) in the direction of arrow 199 for allowing the transfer arms of the transfer unit module 104 to access the processing stations 130 and load ports/load locks. In other aspects the telescoping linear traversing mechanism 400 may be mounted adjacent an end 100E1, 100E2 of the transport chamber 125 for extension along any suitable length of the transport chamber and for allowing transfer arm access to the processing stations 130 and load ports/load locks. In still other aspects the telescoping linear traversing mechanism 400 may be mounted at any suitable location of the transport chamber 125.

The telescoping linear traversing mechanism 400 (which may otherwise be referred to as a telescoping carriage mechanism) may include a base member 410 and at least one telescoping member or carriage 420, 430 movably mounted to the base member 410 in series. The base may be fixedly connected to a wall of the transport chamber 125 at any suitable location, such through the Z-axis lift drive 401. For example, the base member 410 may be mounted to the Z-axis lift drive 401 in any suitable manner so as to be at least partly located within the internal environment of the transport chamber 125. The base member 410 may include any suitable slide mechanism 410T, such as rails or tracks, for movably mounting at least one telescoping member 420, 430 to the base member 410. In this aspect telescoping member 420 includes any slide mechanism 420T1 that interfaces with slide mechanism 410T so as to movably mount telescoping member 420 to the base member 410. As may be realized the interface between the slide mechanisms 410T, 420T1 may be configured to allow reciprocating movement of the telescoping member 420 in the direction of arrow 199 on either side of base member centerline CL1 relative to the base member 410. It should be understood that while the Z-axis drive unit is shown as being substantially located on the centerline CL in other aspects the Z-axis drive unit 401 may be offset from the centerline. It should also be understood that a centerline CL1 of the base member 410 may be substantially coincident or offset from the centerline CL. The telescoping member 420 may also include slide mechanism 420T2 (which may be substantially similar to slide mechanism 410T) for movably mounting telescoping member or robot support 430 to the telescoping member 420. Telescoping member 430 may be a robot support on which one or more transfer arms 450, 451 are located. The telescoping member 430 may include slide mechanism 430T configured to interface with slide mechanism 420T2 and such that the interface is configured to allow reciprocating movement of the telescoping member 430 in the direction of arrow 199 on either side of telescoping member centerline CL2 relative to the telescoping member 420. Each of the base member 410 and telescoping members 420, 430 may have any suitable respective length L2, L3, L4 to allow traversal of the transfer arm(s) of the transfer unit module 104 between the ends 100E1, 100E2 of the transport chamber 125. It should be understood that while the telescoping linear traversing mechanism 400 is illustrated as having three members 410, 420, 430 in other aspects the telescoping linear traversing mechanism may have more or fewer members for providing a telescoping platform or robot support on which one or more transfer arms (and their respective drives) are mounted.

In one aspect the movement of each of the telescoping members may be uncoupled from movement of other ones of the telescoping members (and/or transfer arms) so that each telescoping member (and/or transfer arm) is independently reciprocally driven in the direction of arrow 199 by any suitable drive 470 in any suitable manner. In one aspect, referring also to FIG. 4K, the drive 470 may include one or more drive motors 471, 471', 471", 471''' for independently driving (independent movement of one or more of the transfer arms will be described in greater detail below with respect to FIGS. 7 and 7A) a respective one of the telescoping members 410, 420, 430 and one or more of the transfer arms 450, 451 (relative to another telescoping member and/or the base member and thereby independently effect at least partial telescoping motion of the telescoping linear traversing mechanism 400) in the direction of arrow 199. Each drive motor 471, 471', 471", 471''' may be coupled to its respective telescoping member 410, 420, 430 in any suitable manner such as that described below with respect to the drive motor 471 for telescoping member 420. As an example, in one aspect the drive motor 471 may be fixedly mounted to any suitable portion of base member 410 (or the telescoping member from which the driven telescoping member depends) for driving the driven telescoping member, which in this example, is telescoping member 420. In other aspects the drive motor 471 may be mounted to the driven telescoping member and the drive member 474 (described below) may be anchored to the base member 410 (or the telescoping member from which the driven telescoping member depends). The drive motor 471 may be any suitable drive motor (e.g. linear brushless motor, linear stepper motor, linear variable reluctance motor, etc.) suitable for use within a vacuum environment (or any other suitable environment) such as may be found within the transport chamber 125. In other aspects, the motors may have a rotary configuration and suitable transmission. Any suitable drive pulley 472 may be mounted to an output of the drive motor 471. Idler pulleys 473A, 473B may be mounted to or adjacent ends 420E1, 420E2 (or mounted at any other suitable location) of telescoping member 420. One or more suitable drive member 474 (such as e.g. cord, cable, band, wire, chain, belt, etc.) may span between and interface with pulleys 473A, 473B such that the ends (or other suitable portion of the drive member 474) are wrapped around the drive pulley 472 in a counter-rotating manner so that as one end is wound around the drive pulley the other end is unwound from the drive pulley. A portion of the drive member 474 that spans between the pulleys 473A, 473B may be fixed to any suitable portion of the telescoping member 420 in any suitable manner, such as with any suitable mechanical or chemical fasteners 475. It is noted that while a single drive member 474 is illustrated in other aspects more than one drive member may be used in a similar configuration as that described herein.

As may be realized, in this example, when the drive pulley 472 is rotated in the direction of 497 end 474A of drive member 474 is wound around the drive pulley 472 while end 474B is unwound causing the telescoping member 420 to move in the direction 199B. Similarly, when the drive pulley 472 is rotated in the direction of 496 end 474B of drive member 474 is wound around the drive pulley 472 while end 474A is unwound causing the telescoping member 420 to move in the direction 199A. A similar drive arrangement may be provided between telescoping members 420, 430 for allowing movement of telescoping member 430 relative to telescoping member 420 such that a drive motor 471 is mounted to any suitable portion of the telescoping member 420 and pulleys 473A, 473B are mounted to any suitable portion of telescoping member 430. The drive member 474 may be fixed to the telescoping member 430 in a manner similar to that described above such that as the drive pulley 472 rotates the telescoping member is reciprocated in the direction of arrow 199 depending on the direction of drive pulley rotation. As may be realized, while extension and retraction of the telescoping linear traversing mechanism 400 is described as being performed with motors distributed on the base member and telescoping members, in other aspects the motors for extending and retracting the telescoping linear traversing mechanism 400 may be located at a common location such that suitable drive mechanisms/linkages couple the respective motors to a respective driven member of the telescoping linear traversing mechanism 400 for allowing extension and retraction of the telescoping linear traversing mechanism 400.

In another aspect, the movement of telescoping members 410, 420, 430 in the direction of arrow 199 may be linked together in any suitable manner such that one drive motor effects the telescopic extension/retraction of the telescoping members 410, 420, 430 in the direction of arrow 199 to either side of the centerline CL. For example, any suitable pulley and drive member arrangement may couple the motion of one telescoping member to one or more of the other telescoping members for extending the telescoping linear traversing mechanism 400.

Figure 4D:
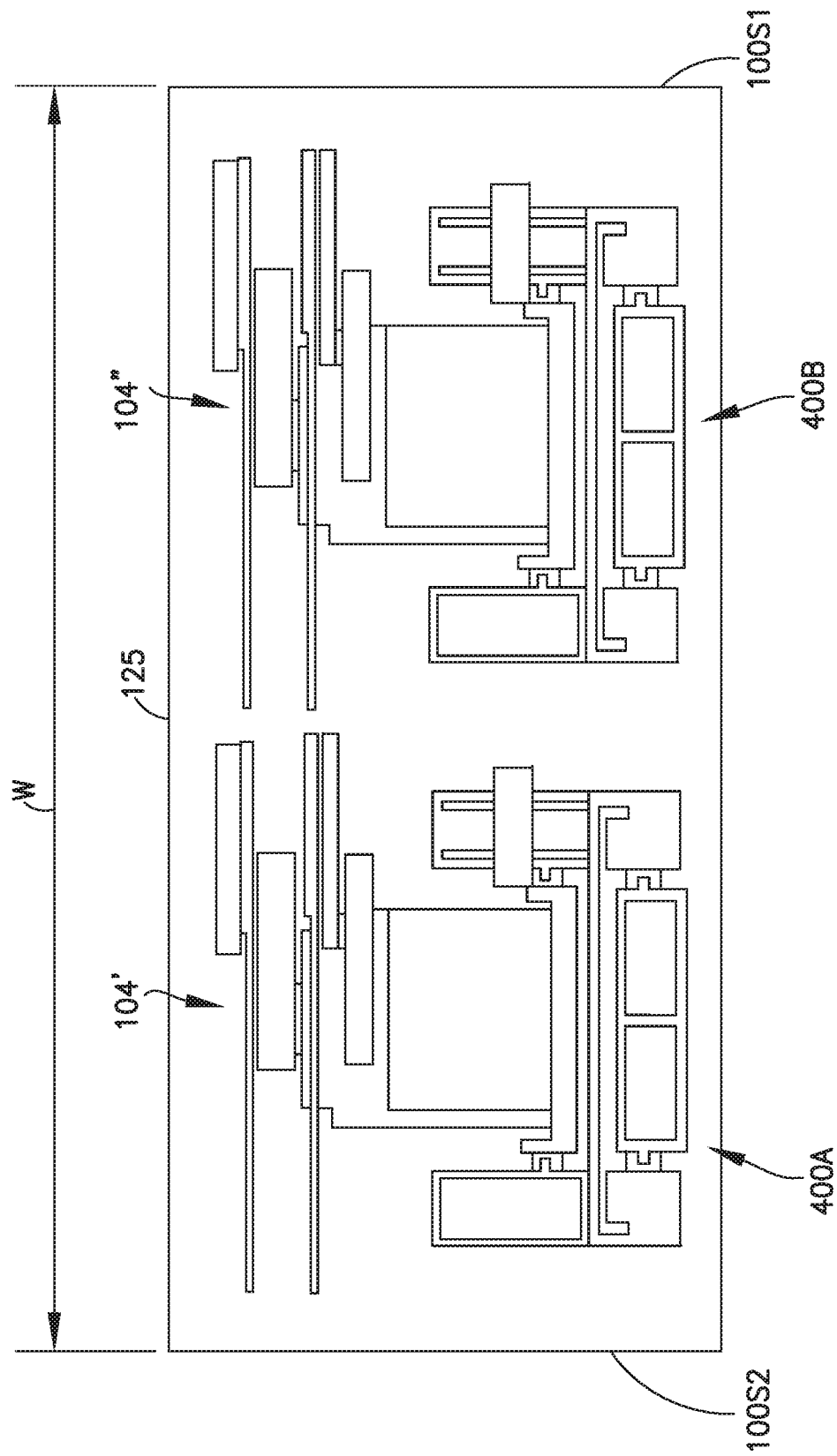
Figure 4E:
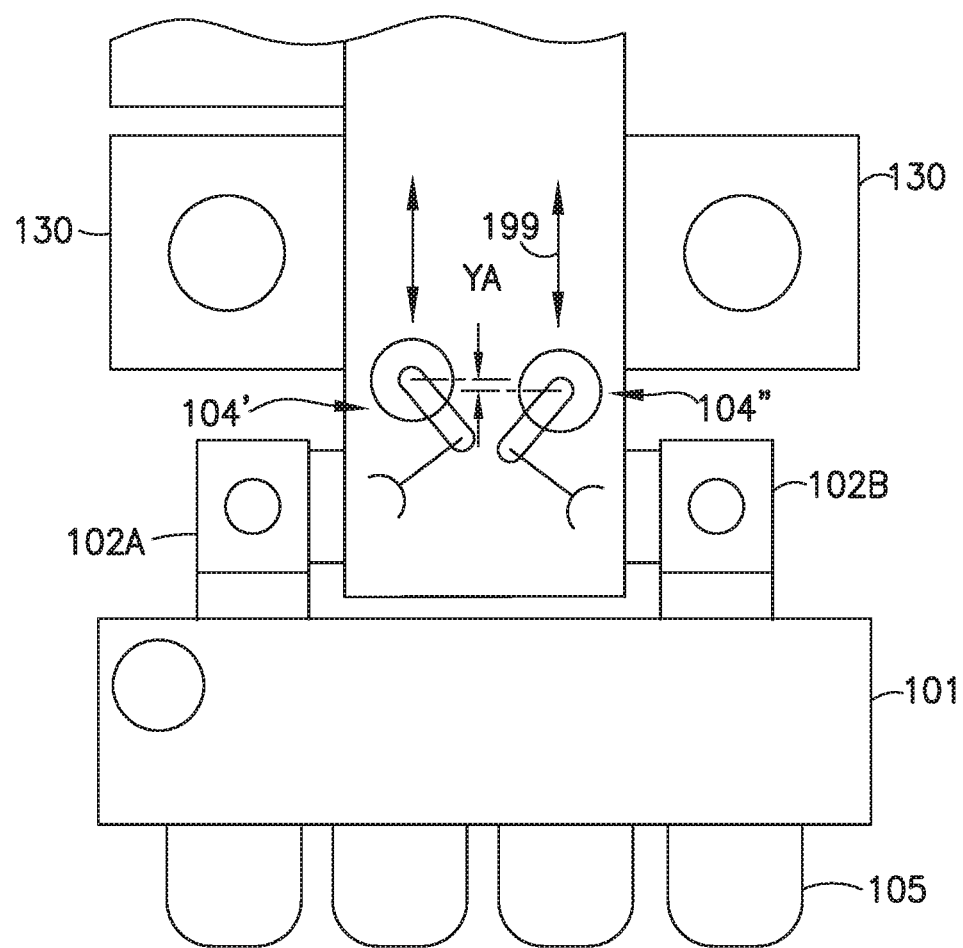
Figure 4F:
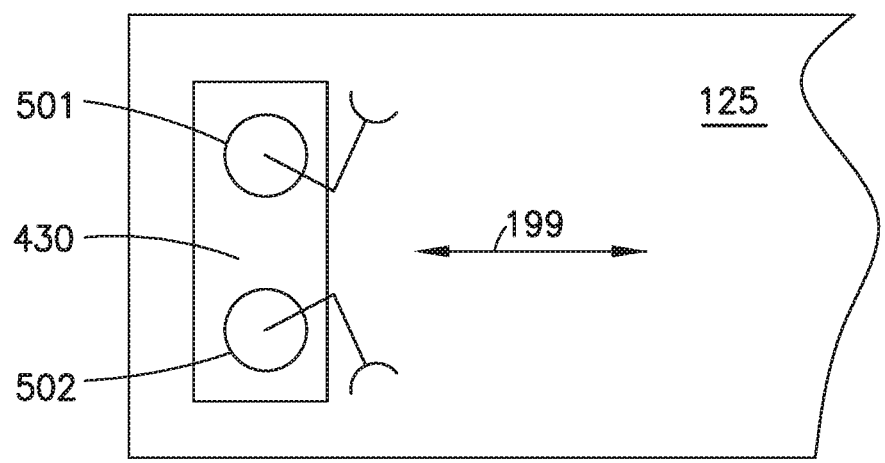
Figure 4G:
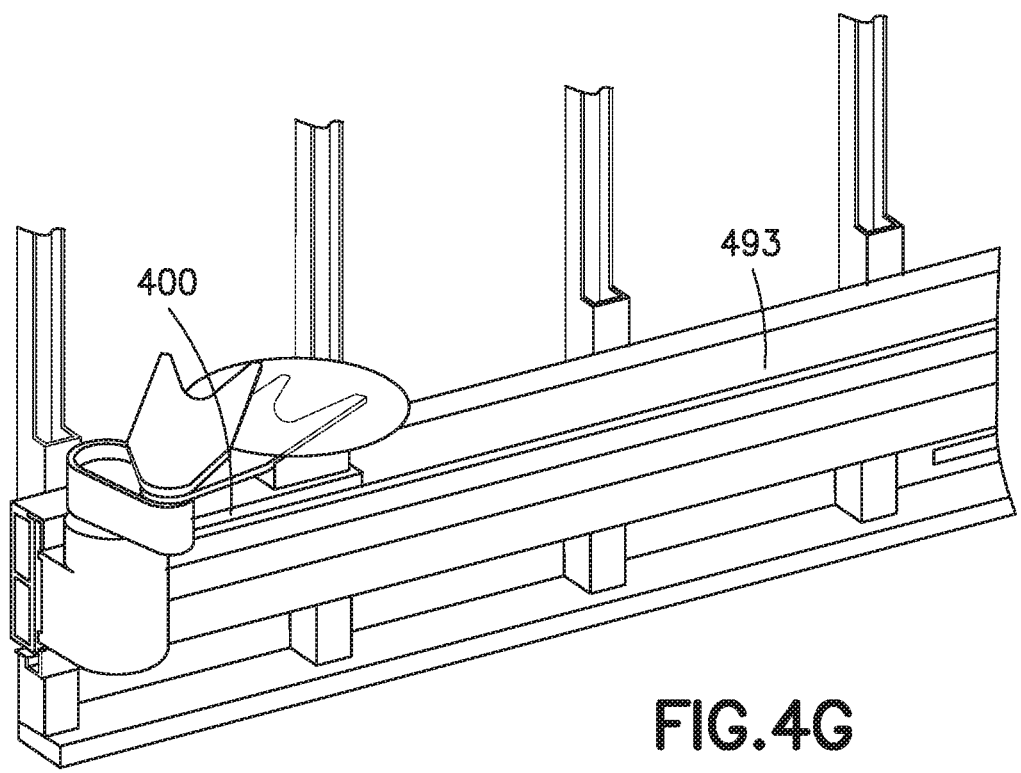
Figure 4H:
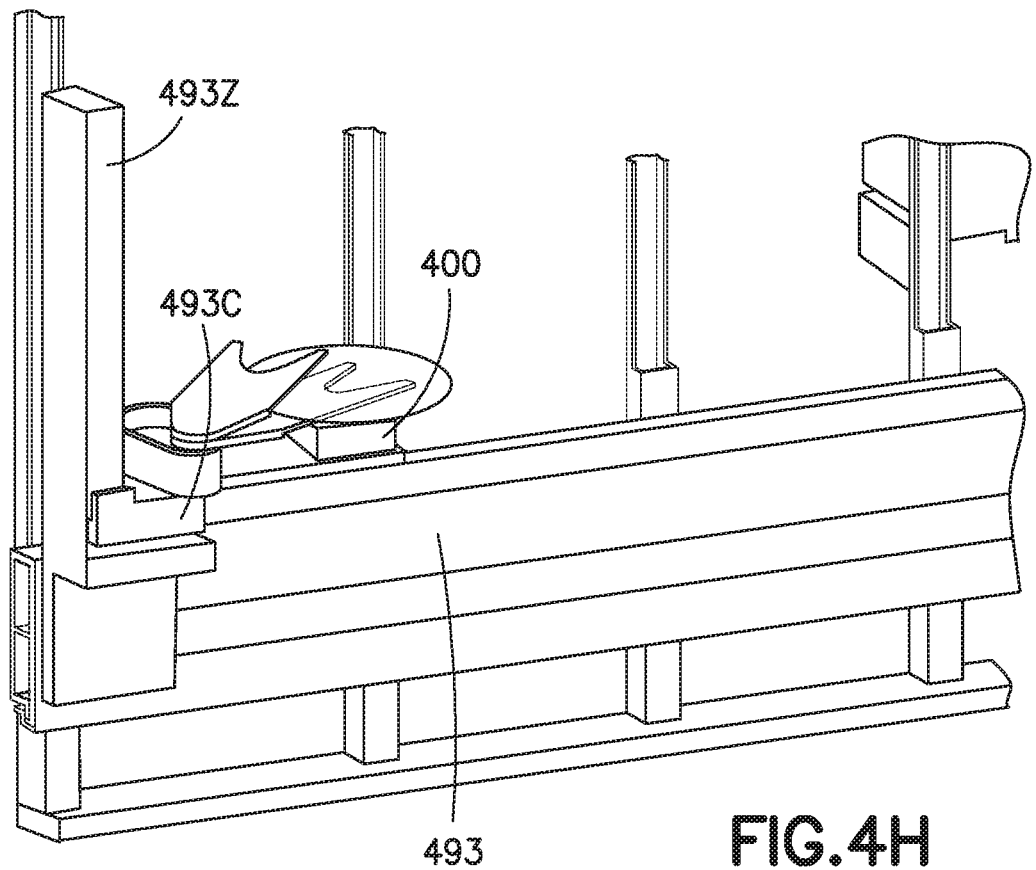
Figure 4I:
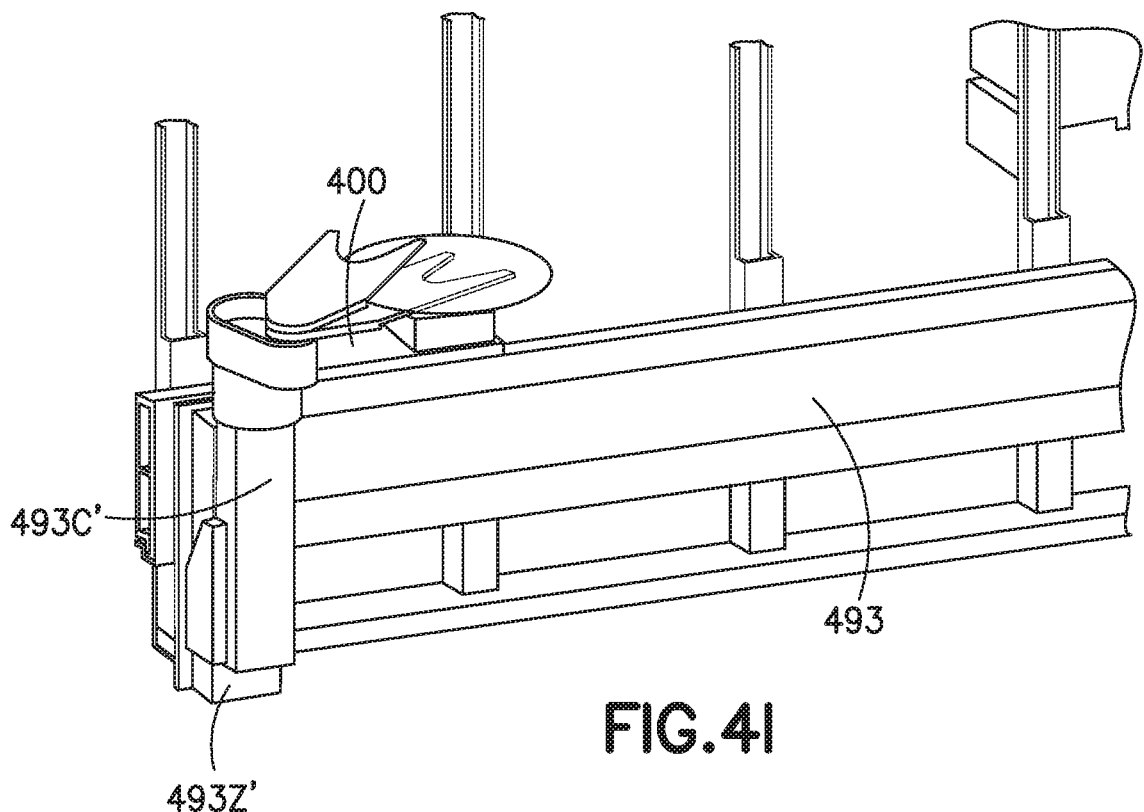
Figure 4J:
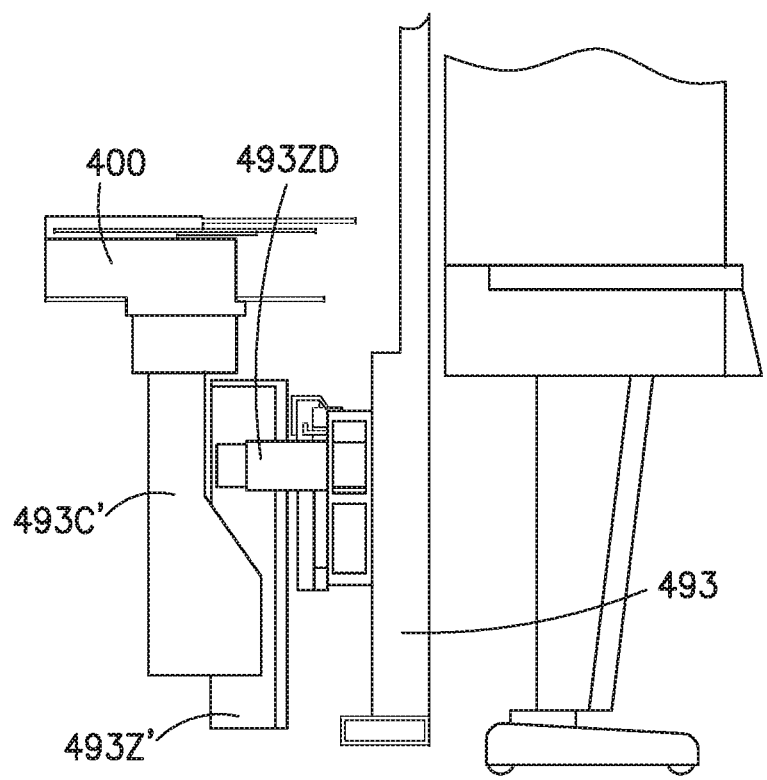

Still referring to FIGS. 4A-4C, in one aspect the transfer unit module 104 may include a telescoping linear traversing mechanism 400 that may substantially span from adjacent one lateral side 100S1, 100S2 of the transport chamber to adjacent the other lateral side 100S1, 100S2 of the transport chamber (e.g. the telescoping linear traversing mechanism 400 spans a width W of the transport chamber). In other aspects, as can be seen in FIG. 4D, the transfer unit module 104 may include more than one transfer unit module 104', 104" each having a respective telescoping linear traversing mechanism 400A, 400B located laterally side by side within the transport chamber 125 where the transport arm(s) 450, 451 (FIG. 4A) of each transfer unit module 104', 104" has a reach such that each arm is capable of transferring substrates through slot valves SV located on either lateral side 100S1, 100S2 of the (e.g. for accessing processing stations, load locks and/or load ports communicably connected thereto) as well as accessing substrate holding stations located on the ends 100E1, 100E2 of the transport chamber 125. In this aspect the side by side telescoping linear traversing mechanisms 400A, 400B allow substantially independent travel of a respective robot support 430 (FIG. 7) in the direction of arrow 199 along a length of the transport chamber 125 (e.g. so a distance YA between robot arms or robot supports changes) in a manner substantially similar to that described in U.S. Pat. No. 7,901,539 issued Mar. 8, 2011, U.S. Pat. No. 8,303,764 issued Nov. 6, 2012, U.S. Pat. No. 8,293,066 issued Oct. 23, 2012 and U.S. Pat. No. 8,419,341 issued Apr. 16, 2013 the disclosures of which are incorporated herein by reference in their entireties. For example, referring also to FIG. 4G the linear traversing mechanism 400 may be mounted to a linear track 493 in a manner similar to that described in U.S. Pat. Nos. 8,419,341, 6,002,840 and 7,648,327, previously incorporated by reference. The linear track 493 may include any suitable drive configured to move the linear traversing mechanism 400 along the length of the track. As may be realized, in one aspect each of the telescoping linear traversing mechanisms 400A, 400B may have a respective Z-axis motor allowing substantially independent Z-axis movement of each telescoping linear traversing mechanisms 400A, 400B while in other aspects the telescoping linear traversing mechanisms 400A, 400B may be mounted to a common Z-axis drive such that the telescoping linear traversing mechanisms 400A, 400B are raised and lowered as a unit. In one aspect, where the linear traversing mechanism is mounted to the linear track 493, the linear traversing mechanism 400 may be mounted on a Z-axis platform or drive in any suitable manner. For example, referring to FIGS. 4H-4J a Z-axis track 493Z, 493Z' may be mounted to the linear track 493 for movement along the linear track 493. The Z-axis track 493Z, 493Z' may include any suitable drive for driving a carriage 493C, 493C' along the Z-axis track 493Z where the linear traversing mechanism is mounted to the carriage 493C, 493C' in any suitable manner. On one aspect the Z-axis track may be configured for telescopic movement and include a telescopic drive mechanism 493ZD (FIG. 4J) that may be substantially similar to that described above with respect to FIGS. 4B and 4C. In still other aspects the telescoping linear traversing mechanism 400A, 400B may include more than one telescoping mechanism such that one telescoping mechanism depends from another telescoping member. For example, a telescoping Z-axis track (as noted above) may be mounted to carriage 430 or the telescoping arm (such as that illustrated in FIG. 4B) may be mounted to the carriage 493C, 493C' of a telescoping Z-axis track. In other aspects as can be seen in FIG. 4F robot drives 501, 502 (which will be described below) may be placed laterally side by side on a common robot support 430 where each robot drive 501, 502 is configured to drive one or more robot arms mounted thereto. In one aspect the laterally side by side robot drives 501, 502 may be fixed relative to one another on the robot support 430 while in other aspects one or more of the laterally side by side robot drives 501, 502 may be movable in the direction of arrow 199 relative to another one of the laterally side by side robot drive 501, 502 in a manner substantially similar to that described herein with respect to FIG. 7 and slide member 700. As may be realized, in one aspect each of the drives 501, 502 may include a respective Z-axis drive configured to allow substantially independent Z-axis movement of one or more robot arm mounted thereto while in other aspects the drives 501, 502 may be mounted to a common Z-axis drive such that the drives 501, 502 are raised and lowered as a unit. In still other aspects the more than one telescoping linear traversing mechanism 400 may be arranged in a vertically opposing arrangement such that the transfer robots 104 of the more than one telescoping linear traversing mechanism 400 are vertically opposed to one another. As may be realized, a telescoping travel path of the transfer unit module 104 (and a path of the carriage on which the transfer robots/arms are located) may cross an axis of entry/exit through a slot valve or other transport chamber opening through which a substrate holding station is communicably coupled to the transport chamber 125.

Positioning of the telescoping member for locating the transfer arms 450, 451 within the transport chamber 125 may be performed in any suitable manner. In one aspect positioning of the telescoping member(s) may be performed with any suitable sensor/sensor arrangement. As may be realized, at least the position of the robot support (in this aspect telescoping member 430), on which the transfer arms 450, 451 are located, is tracked in any suitable manner for locating the transfer arms 450, 451. In one aspect tracking the position of the telescoping member 430 may be performed using encoders of the drive motors 471 as each telescoping member 420, 430 is extended/retracted. In another aspect (referring to FIG. 2), one or more sensors 280S may be placed along or at predetermined locations on one or more walls within the transport chamber 125. The sensors 280S may be any suitable sensors such as, for example, laser or beam sensors, capacitive sensors and/or inductive sensors. In one aspect the sensors 280S may be located within the transport chamber such that each sensor 280S has a predetermined relationship with respect to one or more slot valves (and the processing stations communicably coupled to the slot valves). The sensors 280S may be configured to detect or otherwise sense one or more targets 280T located on the robot support (e.g. in this aspect telescoping member 430) where the targets 280T have a predetermined spatial relationship with respect to the one or more transfer arm 450, 451. As the robot support is moved within the transport chamber the sensors 280S may send any suitable signals to any suitable controller, such as controller 110, when the sensors 280S detect targets 280T. The signals may identify the location of the robot support 430 and, via the spatial relationship between the targets 280T and the one or more transfer arm 450, 451, the location of the one or more transfer arm 450, 451.

In another aspect positioning of the telescoping member 430 may be performed mechanically with any suitable robot support locating features such as for example, pins, recesses, protrusions or any other suitable kinematic coupling configured to establish alignment (in the X, Y and Z planes) between telescoping member 430 and a predetermined processing station 130 and/or load lock/load port 140, 105. In one aspect a locating feature 281S may be mounted at any suitable location within transport chamber 125 such that a predetermined positional relationship is known between the locating feature 281S and a corresponding processing station 130 and/or load lock/load port 140, 105. A mating feature 281T (configured to kinematically mate with the locating feature) may be mounted to a predetermined location of the telescoping member 430 so as to have a predetermined relationship with the one or more transfer arm 450, 451 mounted on the telescoping member 430. As the telescoping member 430 is moved within the transport chamber 125 the mating feature 281T may engage and mate with a locating feature 281S so as to locate the telescoping member 430 within the transport chamber 125 at a known position. In one aspect the locating features 281T may be retractable to allow the telescoping members 420, 430 to pass by the locating features 281T such that the controller 110 may effect deployment of the locating features 281T corresponding to one or more predetermined substrate holding stations (e.g. 105, 130, 140) to/from which substrates are to be picked or placed as the telescoping member 430 advances towards the one or more predetermined substrate holding stations. In other aspects the robot support may be movable in, for example, the Y directions (e.g. transverse to arrow 199) in any suitable manner for engaging a stationary (e.g. non-retractable) locating feature 281T located adjacent a lateral side of the transport chamber 125.

As may be realized, the robot support (e.g. telescoping member 430) positioning may be substantially independent of the kinematics for transfer arm positioning (e.g. for picking and placing substrates to substrate holding stations). For example, once the telescoping member 430 is positioned at a predetermined location within the transport chamber, the location of the transfer arm end effector (e.g. for holding the substrate) may be determined in any suitable manner such as by, for example, encoders of the transfer arm drive section, proximity sensors that detect the transfer arm and/or substrate carried by the arm or any other suitable sensors. Positioning of the telescoping member substantially independent of the kinematics associated with the extension and retraction of the transfer arm may also allow automatic substrate centering. For example, one or more substrate centering sensors AWCS (FIG. 2) may be located at any suitable position(s) within and/or adjacent to the transport chamber 125. In one aspect, one or more substrate centering sensors AWCS may be positioned on telescoping member 430. As the transfer arm(s) extend past these sensors AWCS the sensors may detect a substrate held on the transfer arm and send signals corresponding to a position of the substrate to any suitable controller so that a position of the substrate may be automatically adjusted (e.g. automatic wafer centering) by the transfer arm for placing the substrate in a manner substantially similar to that described in one or more of, for example, U.S. provisional patent application No. 61/843,685 entitled "Process Apparatus with On-The-Fly substrate Centering" filed on Jul. 8, 2013, U.S. Pat. No. 7,880,155 issued Feb. 1, 2011, U.S. Pat. No. 6,990,430 issued Jan. 24, 2006, U.S. Pat. No. 7,925,378 issued Apr. 12, 2011, U.S. Pat. No. 7,792,350 issued Sep. 7, 2010, U.S. Pat. No. 7,859,685 issued Dec. 28, 2010, U.S. Pat. No. 8,125,652 issued Feb. 28, 2012, U.S. Pat. No. 8,253,948 issued Aug. 28, 2012, U.S. Pat. No. 7,894,657 issued Feb. 22, 2011, U.S. Pat. No. 8,270,702 issued Sep. 18, 2012 and U.S. patent application Ser. No. 13/617,333 filed on Sep. 14, 2012 (PG Pub. 2013/0085595), the disclosures of which are incorporated by reference herein in their entireties. As may be realized, the position of the robot support (and a known point, such as the drive axis of rotation, of the transfer arm) are known and the position of the substrate as it is being transferred can be accurately determined by the sensors AWCS and the position of the substrate can be corrected during transport of the substrate for placement at any suitable substrate holding location.

Figure 1J:
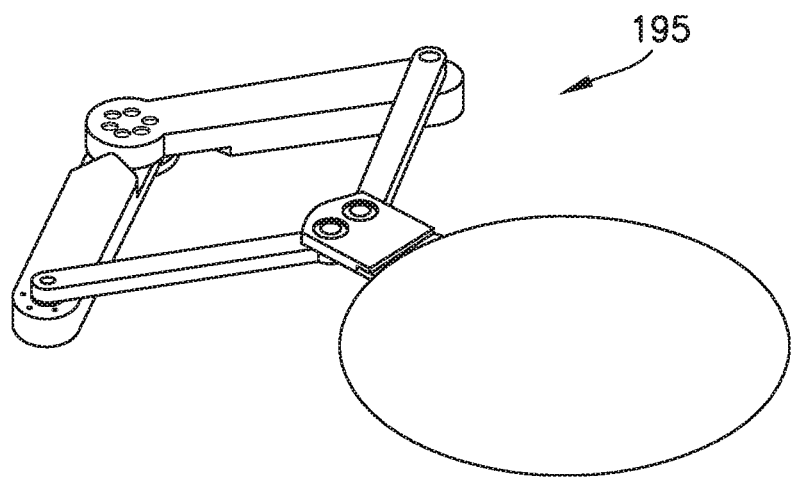
FIGS. 1J-1M are schematic illustrations of robot arms in accordance with aspects of the disclosed embodiment.
Figure 1K:
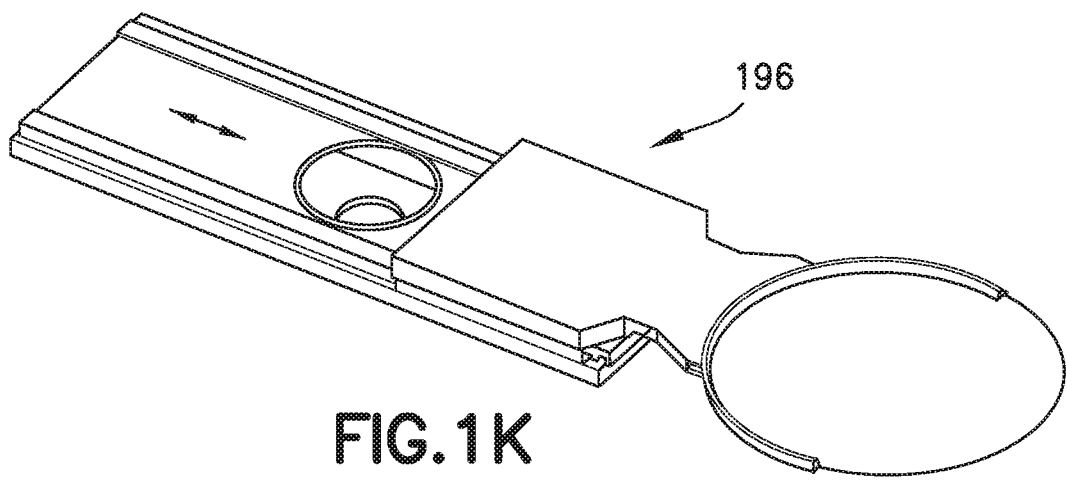
Figure 1L:
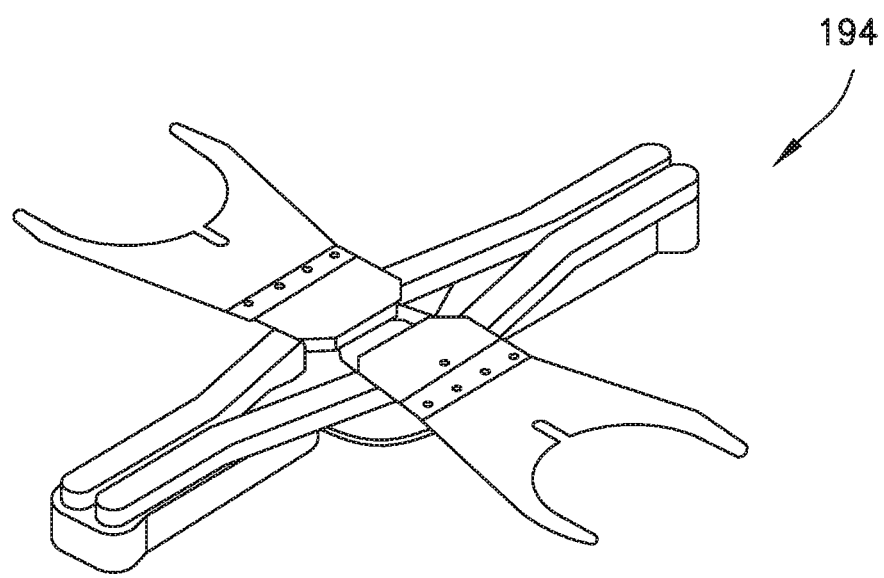
Figure 1M:
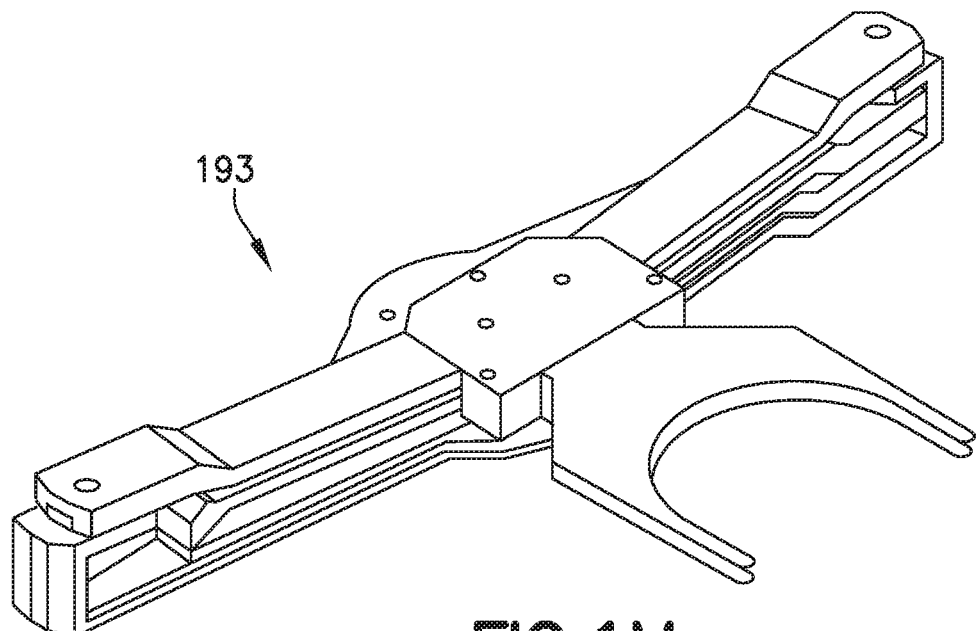

As noted above, at least one transfer robot 104A, 104B is located on a respective robot support (e.g. which in the examples illustrated herein is telescoping member 430) and is configured so that at least one transfer arm of the at least one transfer robot is rotatable relative to the carriage and robot support. In one aspect, two or more transfer robots 104A, 104B may be located on a common mobile base or robot support as illustrated in the Figs. It is noted that to allow access to side by side parallel processing stations (e.g. such as processing stations 130T, 130 in FIG. 1—see also FIGS. 2 and 3A-3B) and/or interaction with end positioned wafer entry load locks (e.g. such as load locks 102A-102D, 202A, 202B) one or more robot drives 501, 502 may be placed on the telescoping member 430 (e.g. each transfer arm 450, 451 has a respective robot drive—FIG. 7). The robot drives 501, 502 may be configured to couple with any suitable transfer arm 450, 451 design configured for operation with a single drive spindle, coaxial drive spindle (e.g. two coaxially arranged drive shafts), tri-axial drive spindle (e.g. three coaxially arranged drive shafts) or any other suitable number of spindles (e.g. one or more drive shafts) arranged coaxially, side by side or a combination thereof. It should be considered that any arm linkage mechanism of which can be coupled with a series of spindle shafts in a coaxially configured manner capable of handling one or more substrates simultaneously or incrementally can be applied to this mechanism. Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the transfer arms 450, 451 may be derived from a conventional SCARA (selective compliant articulated robot arm) type design, which includes an upper arm, a band-driven forearm and a band-constrained end-effector, or from a telescoping arm or any other suitable arm design. Suitable examples of transfer arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. For exemplary purposes only, the transfer arm 450, 451 is described herein as having a general SCARA arm configuration having an upper arm UA, a forearm FA and an end effector or substrate holder EE (see FIG. 7). In other aspects the SCARA arm(s) may have one link, two links, or more than three links and may have any suitable drive pulley arrangement such as a 2:1 shoulder pulley to elbow pulley arrangement and a 1:2 elbow pulley to wrist pulley arrangement. In still other aspects the transport arms may have any other desired arrangement such as a frog-leg arm 195 (FIG. 1J) configuration, a leap frog arm 193 (FIG. 1L) configuration, a bi-symmetric arm 194 (FIG. 1M) configuration, a telescopic arm 196 (FIG. 1K) configuration, bi-symmetric configuration, etc. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties.

Figure 5:
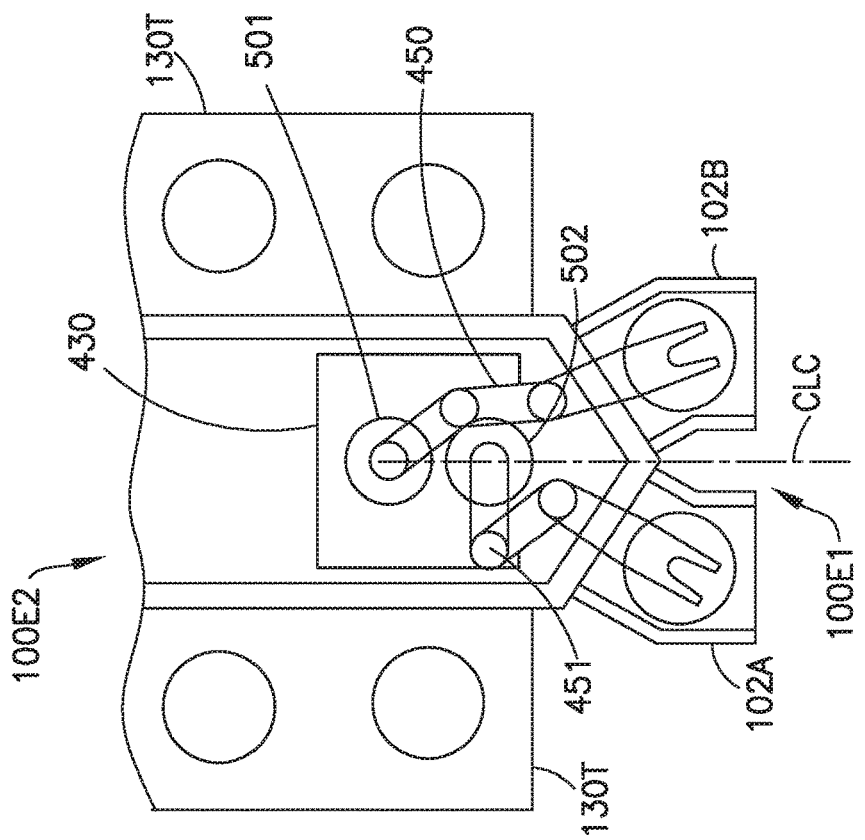
FIG. 5 is a schematic illustration of a portion of a substrate processing apparatus in aspects of the disclosed embodiment.

In an aspect of the disclosed embodiment one robot drive 501, 502 may be positioned on the telescoping member 430 at a higher elevation than the other drive 501, 502 as can be seen in FIG. 4A (e.g. may be located a predetermined height H1 above the other drive(s)) which also places the transfer arms 450, 451 (and their respective end effectors) at different elevations. Placing the robot drives 501, 502 (and their respective arms 450, 451) at different elevations may enable the transfer arms 450, 451 to access, for example, load locks 102A, 102B positioned at an end 100E1, 100E2 of the transport chamber 125 as shown in FIG. 5. As illustrated in, e.g. FIG. 5, the robot drives 501, 502 may be arranged longitudinally one behind the other along a longitudinal center line CLC of the telescoping member 430. In other aspects the drives 501, 502 (and their respective transfer arms 450, 451) may be located at the same height (so that the substrates carried by the arms are transferred in substantially the same plane). In this aspect the motion of the transfer arms 450, 451 may be controlled by, for example, controller 110 to allow one transport arm 450, 451 to pass by the other transfer arm 450, 451 to allow each arm to pick and place substrates from and to a common or different substrate holding locations (e.g. in the aspects of the disclosed embodiments described herein suitable interlocks are provided either mechanically or through the controller to prevent one arm from interfering with another arm regardless of whether the arms are located on a common drive axis or on separate drive axes). For example, one transfer arm, such as transfer arm 450, may pick a substrate from a substrate holding location and may be controlled so as to move the transfer arm 450 to a position that allows the other one of the transfer arms 451 to reach around arm 450 for placing a substrate to that substrate holding location. As may be realized, arm 451 may be similarly moved to allow arm 450 access to a substrate holding location. The relative positioning between the end effectors and the slot valves SV with respect to accessing the various substrate holding stations (e.g. load locks, load ports, processing stations, etc.) along horizontally planar and/or vertically offset transfer planes will be described in greater detail below.

As may be realized, in other aspects the transfer arms 450, 451 may be controlled by, for example, controller 110 so that one transfer arm transfers substrates at an end 100E1 of the transport chamber 125 while the other transfer arm transfers substrates at the other end 100E2 of the transport chamber 125. For example, referring to FIG. 5, in one aspect transport arm 450 may not be capable of extending into load locks 102A, 102B. Here the controller 110 may be suitably programmed such that any substrate that is to be placed in the load locks 102A, 102B is removed from a substrate holding station (such as processing stations 130S, 130T) by transfer arm 451 (e.g. the transfer arm closest to the end 100E1. Similarly, placement of substrates in substrate holding stations located at end 100E2 of the transport chamber 125 (see also FIG. 2) may be removed from the processing stations by transfer arm 450 (e.g. the transfer arm closest to end 100E2).

Figure 6:
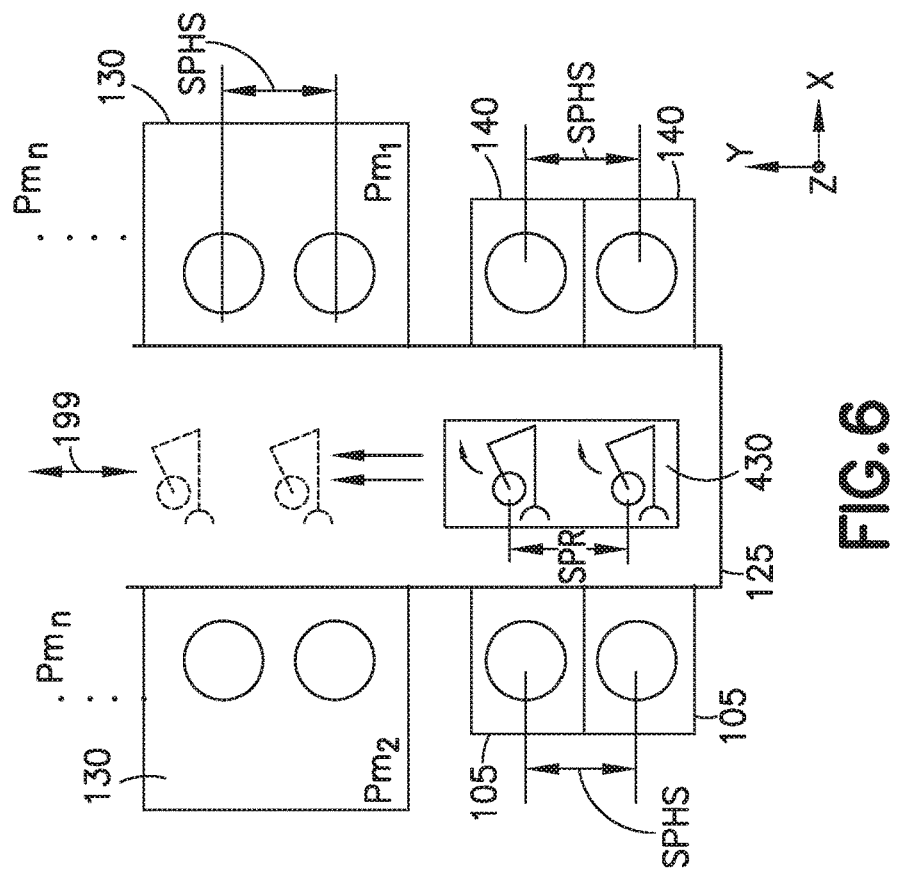
FIG. 6 is a schematic illustration of a portion of a substrate processing apparatus in aspects of the disclosed embodiment.

In one aspect, each robot drive 501, 502 may be fixedly mounted to the telescoping member 430 so as to be longitudinally and laterally (e.g. in the X and Y directions) stationary or fixed relative to the telescoping member 430 as illustrated in FIG. 6. As may be realized the spacing SPR between the robot drives 501, 502 (a rotation axis of which may be coincident with an axis of extension and retraction of the respective transfer arm 450, 451) may be substantially the same as a spacing SPHS between the processing stations 130, load ports 105 and/or load locks 140. As may be realized, where the transfer arms 450, 451 are to access load locks 102A, 102B (or similarly arranged load ports) located at an end of the transport chamber 125 as shown in FIGS. 1 and 5 it is noted that the length or reach of one of the arms 450 may be greater than the length or reach of the other arm 451 to allow the arm 450 to reach around arm 451 for accessing the load locks 102A, 102B (or similarly arranged load ports). The lengths of the arms may be accomplished by increasing the length of one or more arm links UA, FA, EE such that, in one aspect, the arm links all have a substantially similar length, while in other aspects the arm links have unequal lengths.

Figure 7B:
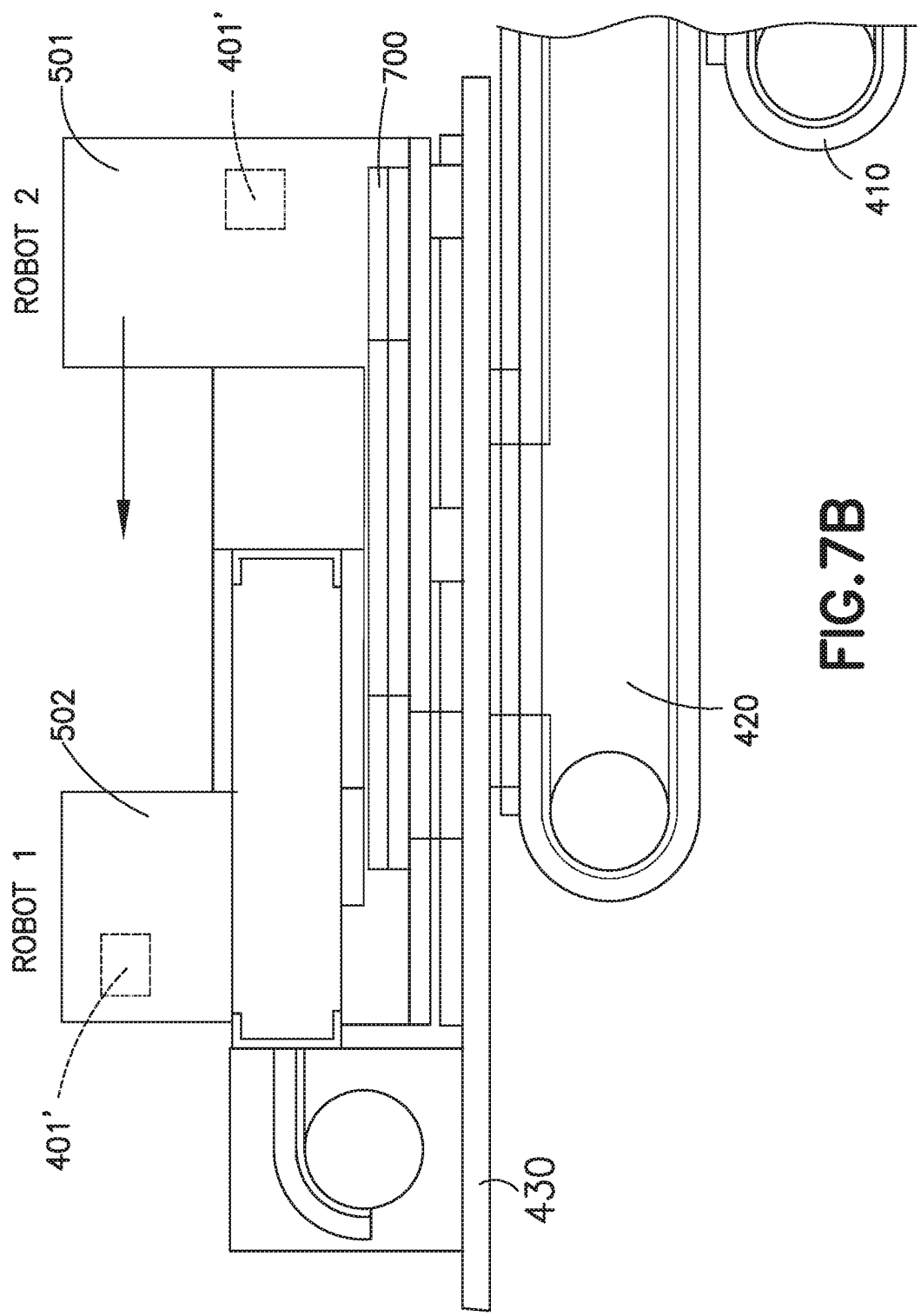

In other aspects, the length or reach of the transfer arms 450, 451 may be substantially similar where at least one of the robot drives 501, 502 is movable relative to the other one of the robot drives 501, 502 and to the telescoping member 430. In still other aspects, the lengths of the transfer arms 450, 451 may be different where at least one of the robot drives 501, 502 is movable relative to the other one of the robot drives 501, 502 and to telescoping member 430. Referring now to FIGS. 7 and 7B one of the robot drives, in this example robot drive 502, is fixedly mounted to the telescoping member 430. Here the telescoping member 430 may include a slide member 700 movably mounted to the telescoping member 430 in any suitable manner where the slide member is driven by drive motor 471" (FIG. 4K) so as to move in direction 199 (e.g. longitudinally along a length of the transport chamber 125) relative to the telescoping member 430. In other aspects the slide member 700 may also be configured to move transversely to direction 199. In one aspect, the movable coupling between the slide member 700 and the telescoping member 430 may be substantially similar to that described above with respect to the telescoping members 430, 420 and base member 410. The other robot drive 501 may be fixedly mounted to the slide member 700 so that as the slide member 700 moves robot drive 501 moves relative to the robot drive 502 changing the spacing SPR (FIG. 6) between the drives. In another aspect, referring also to FIG. 4K, both of the robot drives 501, 502 (and hence the corresponding transfer arms 450, 451 depending therefrom) may be independently movable (e.g. in the direction of arrow 199A, 199B) relative to the telescoping member 430 and to each other. For example, robot drive 502 may also be mounted to the telescoping member 430 by a slide member 700', which may be substantially similar to slide member 700 described above. The slide member 700' may be driven by drive motor 471''' so as to move in direction 199 (e.g. longitudinally along a length of the transport chamber 125) relative to the telescoping member 430. As may be realized, the independent linear movement of each robot drive 501, 502 relative to the telescoping member 430 and to each other enables changing the position relative to the telescoping system and the spacing between the drives 501, 502 (and their respective transfer arms 450, 451). The independent linear movement of each of the robot drives 501, 502 also enables the traversal of each of the respective transfer arms 450, 451 in the direction of arrow 199 at different transport rates. For example, the drives 471, 471', 471", 471''' may drive their respective telescoping members/robot drives in the same direction (such as for maximum linear traverse along the chamber, which may be referred to as coincident motion) or in opposing directions (so that at least one telescoping member or carriage or arm/drive of the telescoping system is moved in an opposite linear direction from another telescoping member or carriage or arm/drive, which may be referred to as crossing or opposing motion). In one aspect the drive 471" may move the robot drive 501 in the direction of arrow 199A while one or more of drives 471, 471', 471''' move their respective telescoping member/robot drive in the direction of arrow 199B so that transfer arm 450 remains substantially stationary in the direction of arrow 199 while the transfer arm 451 moves in the direction of arrow 199B towards the transfer arm 450 or vice versa.

As may be realized, in one aspect changing the spacing SP1 between the drives with one or more of the slide members 700, 700' allows the pivot or shoulder axes of the transfer arms 450, 451 to move closer together allowing the length or reach of the transfer arms 450, 451 to be substantially the same or otherwise decrease a difference in reach or length between the transfer arms when compared to the robot drives having the fixed spacing SPR described above with respect to FIG. 6. In another aspect changing the spacing SP1 between the drives with one or more of the slide members 700, 700' allows the pivot or shoulder axes of the transfer arms 450, 451 to move closer together so that the spacing SP1 between the transfer arms may be adjusted to substantially match the spacing SP2 between any adjacent process modules 130T (see FIG. 1). Moving the shoulder axes of the transfer arm arms closer together may also allow the arms to access a common substrate station and allow for the fast swapping of substrates substantially without movement of the telescoping member 430. As may be realized, the slide member 700 may be cantilevered from the telescoping member 430 as shown in FIG. 7A so that as the slide member 700 moves in direction 199 a length LX of the telescoping member 430 changes which may allow for accessing load locks 102A, 102B (or similarly arranged load ports 105) at either end 100E1, 100E2 of the transport chamber 125.

Figure 4L:
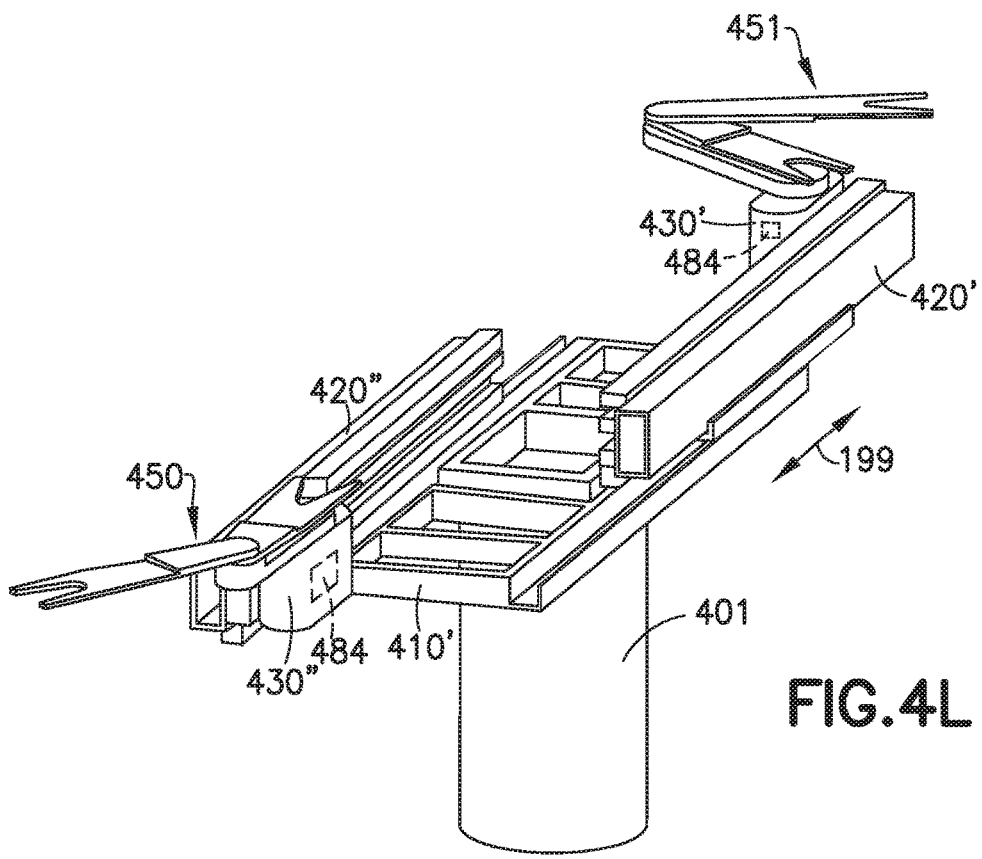
Figure 4M:
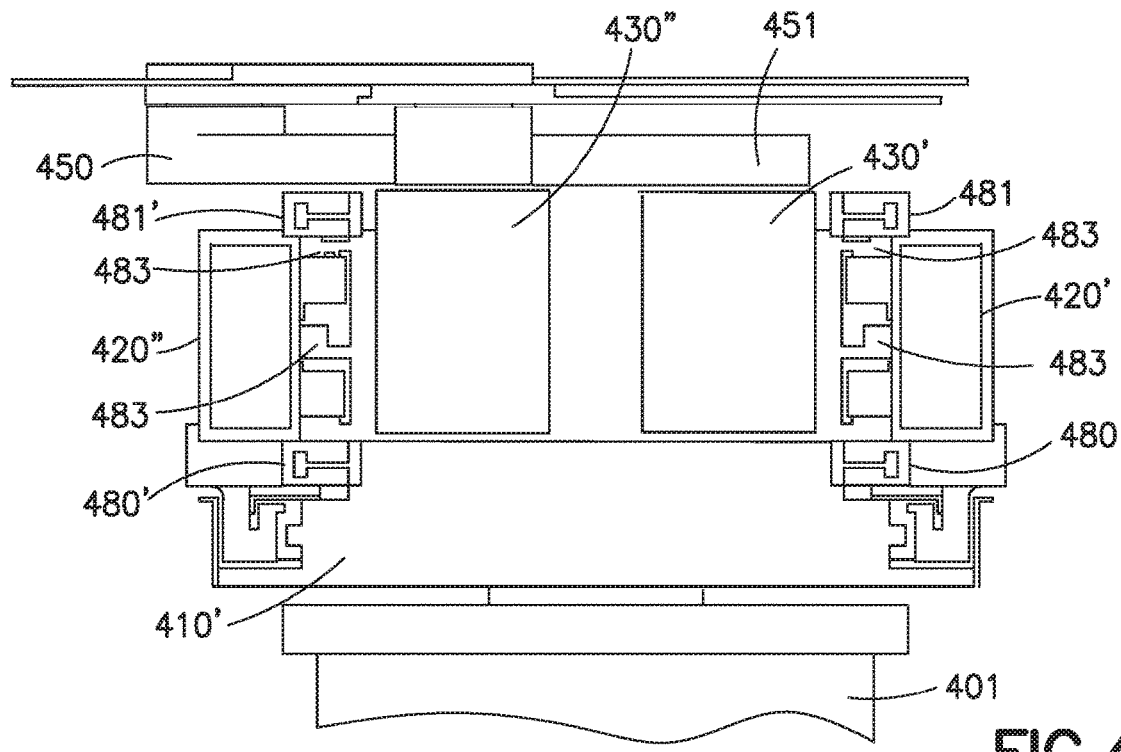

Referring to FIGS. 4L and 4M, in accordance with an aspect of the disclosed embodiment, the transfer arms 450, 451 may be independently linearly movable relative to each other (in a manner generally similar to that described above). In this aspect a base member 410' is mounted to the drive 401. One or more telescoping members or carriages 420', 420" are movably coupled or mounted to base member 410' (each carriage may be independent of the other). The transfer arms 450, 451 are mounted to respective arm drive telescoping members or carriages 430', 430" which are movably coupled or mounted to a respective telescoping member 420', 420". In this aspect the telescoping members 420', 420", 430', 430" may be driven by a direct drive motor such as for example, a linear motor. For example, any suitable linear motors 480, 480' may be mounted to the base member 410' for driving a respective telescoping member 420', 420" (e.g. the windings of the motor may be disposed on the base member and a movable platen or driven member may disposed on the telescoping member or vice versa). Any suitable linear motors 481, 481' may be mounted to a respective telescoping member 420', 420" for driving a respective telescoping member 430', 430" (e.g. the windings of the motor may be disposed on the telescoping member 420', 420" and a movable platen or driven member may disposed on the telescoping member 430', 430" or vice versa). In other aspects, rotary motors such as those described above with respect to FIG. 4C may be disposed on one or more of the base member 410' and the telescoping members 420', 420", 430', 430" for moving the telescoping members in the direction of arrow 199. Any suitable encoders 483 may be provided for sensing or otherwise tracking a position of a respective one of the telescoping members 420', 420", 430', 430". As may be realized the telescoping member 430', 430" may include any suitable number of drives 484 for driving the arm link(s) and end effector(s) of the respective transfer arms 450, 451. In this aspect, the independent linear movement of each of the transfer arms 450, 451 and the telescoping members 420', 420" relative to each other and the base member 410' allows movement of the transfer arms 450, 451 in the direction of arrow 199 relative to the secondary link member in any ratio of movement. For example, in this aspect the linear telescoping system may have two or more independent linear telescoping sections each with one or more resident arms, and each independent linear telescoping section having (but not limited to) two or more linear degrees of freedom in the direction of arrow 199. The arms resident on each independent linear telescoping section may have at least two degrees of freedom (e.g. two drive axes for rotation and extension and may be provided with a fast swap degree of freedom). In one aspect the transfer arms 450, 451 may have a common Z axis movement drive while in other aspects one or more of the transfer arms 410, 451 may be independently movable in the Z direction. For example, the base member 410' could remain static as the robot arm 450, 451 (coupled to a respective telescoping member 420', 420") moves along the respective telescoping member 420', 420" to an extent of travel within the respective telescoping member 420', 420". This may allow for movement of the transfer arms 450, 451 in the direction of arrow 199 without moving the respective telescoping member 420', 420".

Figure 8:
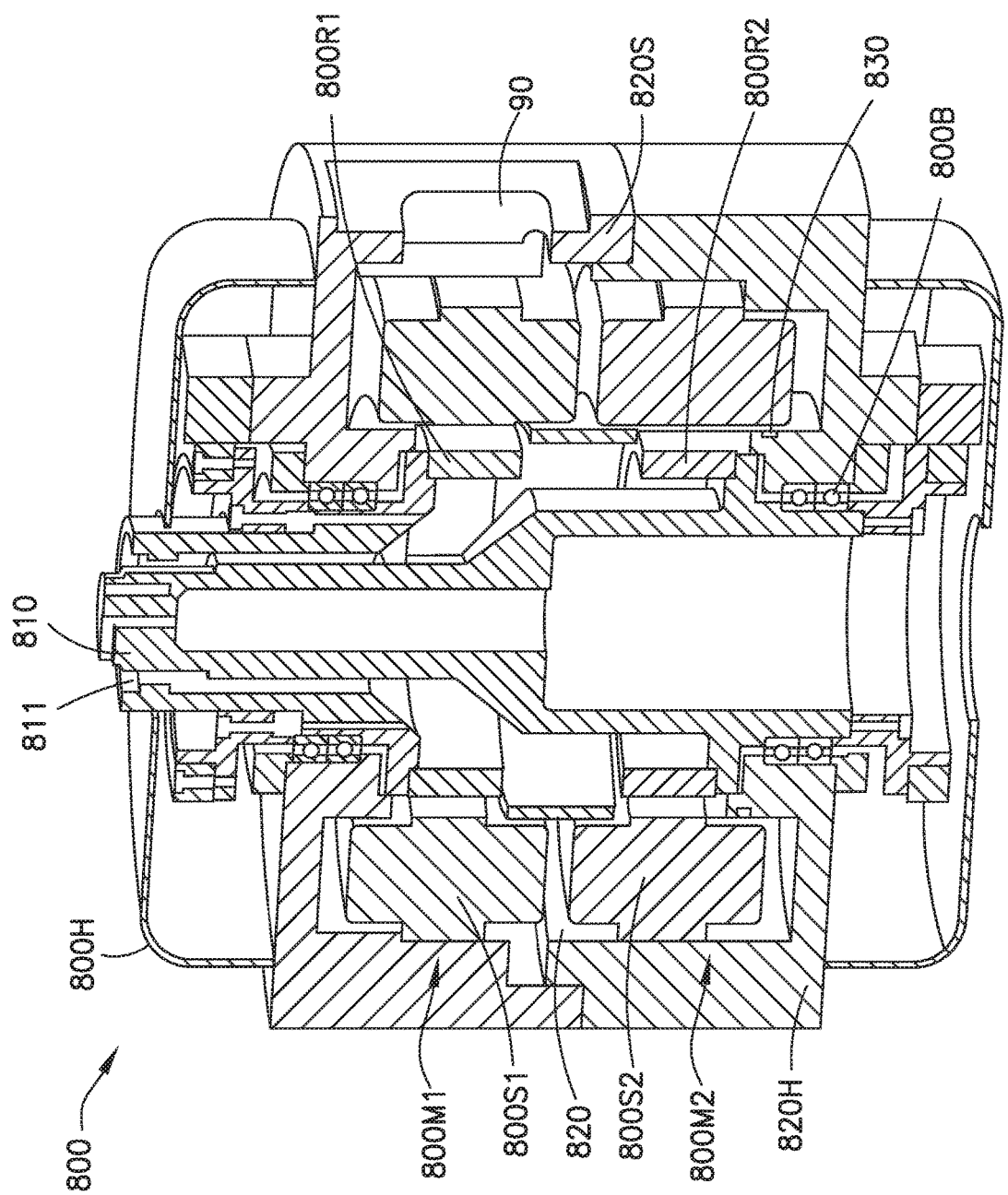
FIG. 8 is a schematic illustration of a transfer robot drive section in accordance with aspects of the disclosed embodiment.

Referring now to FIG. 8, a schematic illustration of a portion of a robot drive 800 is illustrated. The robot drive may be employed in any suitable environment such as a vacuum environment of the transport chamber 125. The robot drive 800 may be substantially similar to drives 501, 502 described above and include a drive housing 800H having at least one drive shaft 810, 811 at least partially disposed therein. In one aspect the robot drive housing 800H may be a sealed housing configured so that the electrically powered components of the robot drive (e.g. the stator, sensors, etc.) are isolated or otherwise sealed from the environment within the transport chamber 125. For example, the stators 800S1, 800S2 may be located in one or more sealed chambers 820. The sealed chambers may be formed from at least any suitable housing members 820H (which may form at least part of the housing 800H) and a barrier or seal 830. The housing members 820H may be integrally formed with housing 800H or the housing members 820H may be coupled to a frame for form the housing 800H. As may be realized any suitable seals 820S may be provided between housing members 820H and/or housing 800H to seal the electrically powered components of the robot drive from an external environment in which the drive operates. The barrier 830 may be located between the stators 800S1, 800S2 and their respective rotors 800R1, 800R2 so that the rotors operate within the external environment and are driven by the stators through the barrier 830 (which may be disposed between the moving parts of the robot drive and/or sensors and the corresponding stationary parts of the robot drive and/or sensors). In this example, the drive 800 is a two axis drive but in other aspects the drive may have any suitable number of axes.

The drive shafts 810, 811 may be mechanically suspended or magnetically suspended within the housing 800H in any suitable manner. In this aspect the drive shafts 810, 811 are suspended within the housing by any suitable bearings 800B but in other aspects the drive shaft may be magnetically suspended (e.g. a self-bearing drive) in a manner substantially similar to that described in U.S. Pat. No. 8,283,813 entitled "Robot Drive with Magnetic Spindle Bearings" issued on Oct. 9, 2012, the disclosure of which is incorporated by reference herein in its entirety. Each drive 810, 811 shaft of the drive 800 may be driven by a respective motor 800R1, 800R2 where each motor includes a stator 800S1, 800S2 and a rotor 800R1, 800R2. It is noted that the drive motors described herein may be permanent magnet motors, variable reluctance motors (having at least one salient pole with corresponding coil units and at least one respective rotor having at least one salient pole of magnetic permeable material), or any other suitable drive motors. The stator(s) 800S1, 800S2 may be fixed within the housing as noted above and the rotor(s) 800R1, 800R2 may be fixed in any suitable manner to a respective drive shaft 810, 811. In one aspect, as noted above, the stators 800S1, 800S2 may be located in an environment that is sealed from an atmosphere in which the robot arm(s) 450, 451 operate (the atmosphere in which the robot arm(s) operate is referred to herein as a "sealed" environment which may be a vacuum or any other suitable environment) through the employment of the isolation wall or barrier 830 while the rotors 800R1, 800R2 are located within the sealed environment in a manner substantially similar to that described in U.S. Pat. No. 5,720,590 issued on Feb. 24, 1998, U.S. Pat. No. 5,899,658 issued on May 4, 1999 and U.S. Pat. No. 5,813,823 issued on Sep. 29, 1998, the disclosures of which are incorporated by reference herein in their entireties.

Figure 9:
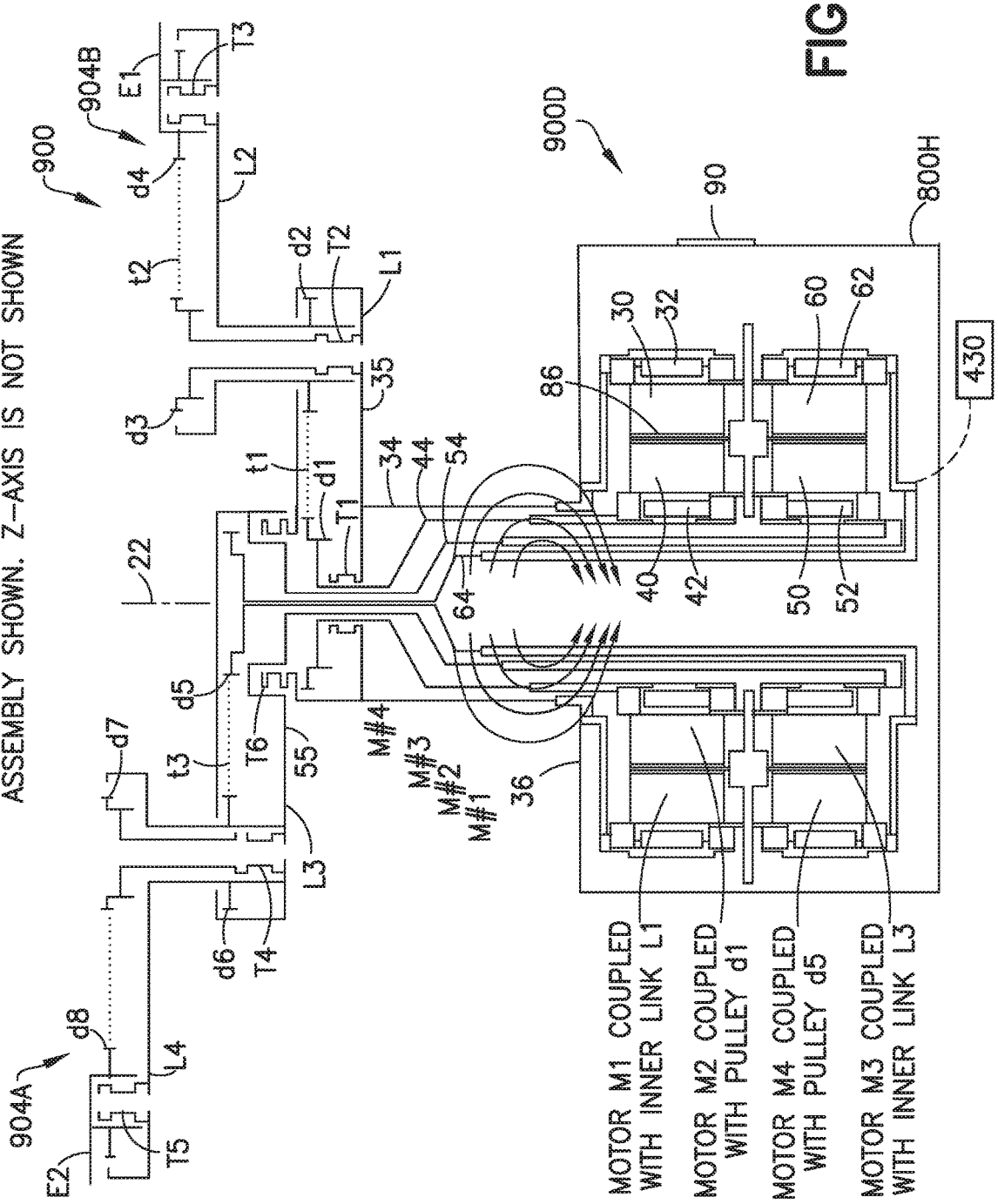
FIG. 9 is a schematic illustration of a transfer robot in accordance with aspects of the disclosed embodiment.

Still referring to FIG. 8, in this aspect the motors 800M1, 800M2 are shown in a stacked arrangement (e.g. in line and arranged one above or one in front of the other). However, it should be understood that the motors 800M1, 800M2 may have any suitable arrangement such as a side by side or concentric arrangement as shown in FIG. 9. For example, in one aspect the motors may be low profile planar or "pancake" style robot drive configuration where the motors are concentrically nested within each other in a manner substantially similar to that described in U.S. Pat. No. 8,008,884 entitled "Substrate Processing Apparatus with Motors Integral to Chamber Walls" issued on Aug. 30, 2011 and U.S. Pat. No. 8,283,813 entitled "Robot Drive with Magnetic Spindle Bearings" issued on Oct. 9, 2012, the disclosures of which are incorporated by reference herein in their entireties.

It is noted that the drives described herein may carry any suitable type of transfer arm (as noted above) configured to transport, for example, semiconductor wafers, flat panels for flat panel displays, solar panels, reticles or any other suitable payload. It is also noted that the drives described herein may also carry any suitable number of transfer arms. It is noted (as seen in FIG. 1) that each drive may have the same or a different number of transfer arms mounted thereto. For example, in one aspect, the drive illustrated in FIG. 8 may be configured to drive a single transfer arm (see for example transfer robot 104A in FIG. 1) such that the upper arm is driven by, for example drive shaft 811 and the forearm is driven by drive shaft 810 such that the end effector is slaved to move along and remain substantially parallel with an axis of extension and retraction of the transfer arm (in other aspects any suitable slaved driving arrangement may be employed). In other aspects, as can be seen in FIG. 9 (see also transfer robot 104B in FIG. 1) each of the one or more drives, such as drive 900D, mounted to the telescoping member 430 may be configured to independently drive (e.g. in extension and rotation) or jointly drive (e.g. one or more of the rotation and extension are coupled) two or more transfer arms 904A, 904B in a manner substantially similar to that described in U.S. Pat. No. 7,891,935 issued on Feb. 22, 2011, the disclosure of which is incorporated by reference herein in its entirety.

Referring to FIG. 9, a four-axis drive system is illustrated. Here the two transfer arms 904A, 904B mounted to a common drive spindle of the robot assembly 900 are independently operable. As may be realized, the controller 110 may include any suitable interlocks (mechanical interlocks may also be employed) configured to rotate each arm so that operation of one arm does not interfere with operation of the other arm when picking and placing substrates to and from substrate holding stations located at the lateral sides and/or ends of the transport chamber 125. In this context, it will be appreciated that the term "four-axis" refers to the system of revolute joint/link pairs that allow the motion of the limbs of the arms in a plane described by polar R-θ coordinates. The mechanism of the vertical displacement of the arm is not included in the term "four-axis." Thus, the number of degrees of freedom (described as four-axis) does not take into account the entire robot's manipulator, but rather only the transfer arms.

In this aspect, the transfer arms are independently rotatable about the revolute joints T1 and T6, wherein rotation of an individual transfer arms is a change in the θ coordinate of the end effector mounting flange, the last link of the manipulator. As a result of the coaxial position of the T1 and T6 joints, the rotation occurs about the common axis 22. Also, the end effector mounting flanges E1, E2 are independently extendible and retractable via the linkage defined by the inner links L1, L3, the outer links L2, L4 (e.g. upper arms), and the rotary joints T1 through T6 along a centerline drawn along the end effector and projected toward the common axis 22. Two actuator assemblies are provided for each arm to effect these extension/retraction and rotation motions. The four actuators are housed within any suitable housing (such as housing 800H described above), mounted to the telescoping member 430 and connected via co-axially located shafts 34, 44, 54, 64 to the transfer arms 904A, 904B. Two actuators are connected to the housings of the inner links L1 and L3, while the other two actuators are connected to pulleys located in the joints T1 and T6 of the inner links L1 and L3. The action of the linkages and the actuator assemblies, in particular when embodied as motors M1, M2, M3, M4, is discussed further below.

In this aspect, motion of the end effector mounting flanges E1, E2 is produced by manipulation of the inner and outer links incorporating a series of belts and pulleys. As illustrated, the inner link L1 is connected to the telescoping member 430 via the shoulder rotary joint T1. The outer link L2 is connected to the inner link L1 via the elbow rotary joint T2. The end effector mounting flange E1 is connected to the outer link L2 via the wrist rotary joint T3. The links and joints of this part of the manipulator form a kinematic chain that is open at one end and connected to the telescoping member 430 at the other. The end effector, which is not a part of the schematic and is not shown, is connected to the end effector mounting flange E1.

Referring to transfer arm 904B, a pulley d1 is provided at the shoulder rotary joint T1, and a pulley d2 is provided at the elbow rotary joint T2. A belt t1 extending along the inner link L1 is connected to the pulleys d1 and d2. The pulley d2, while physically located in the inner link L1, is mounted to the link L2 and, as a part of the elbow rotary joint T2, allows rotation of the link L2 about the joint axis of the preceding link L1. A pulley d3 is also provided at the elbow joint T2, and a pulley d4 is provided at the wrist rotary joint T3. The pulley d3, while located physically in the link L2, is attached to the link L1 and is a part of the axis about which the elbow joint T2 of the link L2 revolves. The pulley d4, while physically located within the link L2, is attached to the end effector mounting flange E1 and, as a part of the wrist joint T3, allows the rotation of the end effector mounting flange E1 about the joint axis of the preceding link L2. A belt t2 is connected to the pulleys d3 and d4. The pulley d3, fixed to the link L1 at the axis about which the elbow joint T2 of the link L2 rotates, travels with the housing of the link L1 when the shoulder joint T1 of the link L1 is rotated about the common axis 22. When the link L1 is rotated, the pulley d2 is also constrained to move with the link L1, which causes the pulley d2 to move in a fashion similar to the movement of a satellite gear of a planetary gear box. The pulley d2 rotates around the common axis 22 of the shoulder joint T1, because it is attached to the distal axis of the inner link L1 via the elbow joint T2. As a part of the elbow joint T2, the pulley d2 also rotates about the distal axis of the preceding link L1. The rotation occurs as a result of the pulley d2 being connected to the pulley d1 via a belt t1, such as a timing belt, chain, or cable.

The ratio between the diameters of the pulleys d1 and d2 effects the relative angular displacement of the pulley d2, depending on the amount of angular displacement given to the actuator input connected to the link L1 (e.g., motor M1) and the actuator input connected to the pulley d1 (e.g., motor M2). A complete description of the position of the axis and orientation of the elbow joint T2 (of which the pulley d2 is a part), in the polar coordinate system based at the polar axis located co-axially with the axis 22 of the shoulder joint T1, depends upon the length of the link L1, the input angular displacement values to the pulley d1 (via motor M2) and link L1 (via motor M1), and the pulley diameter ratio d1/d2. Thus, the R-θ coordinates of the proximal end of the subsequent link L2 attached to the elbow joint T2 and the orientation of the link L2 around the T2 joint axis of rotation are defined. R-θ coordinates of the distal end of the link L2, which contains the axis of rotation of the wrist joint T3, depend on the length of the link L2.

The position in the R-θ coordinate system of the proximal end of the end effector mounting flange, link E1, attached to the wrist joint T3 and the orientation of E1 around the T3 joint axis of rotation depends on the following conditions: the angular input value to the link L1 (via motor M1), the angular input value to the pulley d2 (via motor M2), the length of the link L1, the pulley diameter ratio d1/d2, the length of the link L2, and the pulley diameter ratio d3/d4.

The other transfer arm 904A is similar. Thus, the inner link L3 is connected to the telescoping member 430 via the shoulder rotary joint T6. The outer link L4 is connected to the inner link L3 via the elbow rotary joint T4. The end effector mounting flange E1 is connected to the outer link L4 via the wrist rotary joint T5. The links and joints of this part of the manipulator form a kinematic chain that is open at one end and connected to the telescoping member 430 at the other. The outer link L4 is coupled to the end effector mounting flange E2 via the wrist rotary joint T5.

A pulley d5 is provided at the shoulder rotary joint T6, and a pulley d6 is provided at the elbow rotary joint T4. A belt t3 extending along the inner link L3 is connected to the pulleys d5 and d6. The pulley d6, while physically located in the inner link L3, is a part of and mounted to the link L4 and, as a part of the elbow joint T4, allows rotation of the link L4 about the joint axis of the preceding link L3. A pulley d7 is also provided at the elbow joint T4, and a pulley d8 is provided at the wrist rotary joint T5. The pulley d7, while located physically in the link L4, is attached to the link L3 and is a part of the axis about which the elbow joint T4 of the link L4 revolves. The pulley d8, while physically located within the link L4, is attached to the end effector mounting flange E2 and, as a part of the wrist joint T5, allows the rotation of the end effector mounting flange E2 about the joint axis of the preceding link L4. A belt t4 is connected to the pulleys d7 and d8. The pulley d7, fixed to the link L3 at the axis about which the elbow joint T4 of the link L4 rotates, travels with the housing of the link L3 when the shoulder joint T6 of the link L3 is rotated about the common axis 22. When the link L3 is rotated, the pulley d6 is also constrained to move with the link L3, which causes the pulley d6 to move in a fashion similar to the movement of a satellite gear of a planetary gear box. The pulley d6 rotates around the common axis 22 of the shoulder joint T6, because it is attached to the distal axis of the inner link L3 via the elbow joint T4. As a part of the elbow joint T4, it also rotates about the distal axis of the preceding link L3. The rotation occurs as a result of the pulley d6 being connected to the pulley d5 via a belt t3, such as a timing belt, chain, or cable works.

The ratio between the diameters of the pulleys d5 and d6 effects the relative angular displacement of the pulley d6, depending on the amount of angular displacement given to the actuator input connected to the link L3 (e.g., motor M3) and the actuator input connected to the pulley d5 (e.g., motor M4). A complete description of the position of the axis and orientation of the elbow joint T4 (of which the pulley d6 is a part), in the polar coordinate system based at the polar axis located co-axially with the axis 22 of the shoulder joint T6, depends upon the length of the link L3, the input angular displacement values to the pulley d5 (via motor M4) and link L3 (via motor M3), and the pulley diameter ratio d5/d6. Thus, the R-θ coordinates of the proximal end of the subsequent link L4 attached to the elbow joint T4 and the orientation of the link L4 around the T4 joint axis of rotation are defined. R-θ coordinates of the distal end of the link L4, which contains the axis rotation of the wrist joint T5, depend on the length of the link L4.

The position in the R-θ coordinate system of the proximal end of the end effector mounting flange, link E2, attached to the wrist joint T5 and the orientation of E2 around the T5 joint axis of rotation depends on the following conditions: the angular input value to the link L3 (via motor M3), the angular input value to the pulley d5 (via motor M4), the length of the link L3, the pulley diameter ratio d5/d6, the length of the link L4, and the pulley diameter ratio d7/d8.

Still referring to FIG. 9, a motor M1 is coupled via shaft 34 with the inner link L1. A motor M2 is coupled via shaft 44 with the pulley d1. A motor M3 is coupled via shaft 54 with the inner link L3. A motor M4 is coupled via shaft 64 with the pulley d5. The motor M1 includes a stator 30 and a rotor 32 concentrically surrounding the common axis 22. The rotor is coupled to a hollow shaft 34 that extends upwardly to couple with the housing 35 of the inner link L1. In this way, the shaft rotates with the rotor.

The motor M2 includes a stator 40 and a rotor 42, also concentrically surrounding the common axis 22 and located inwardly of the motor M1. The rotor 42 of the motor M2 is coupled to a hollow shaft 44 that extends upwardly to couple with the pulley d1. The shaft is located concentrically inwardly of the shaft 34 of the motor M1 and rotates with the rotor 42.

The motors M3 and M4 are located below the motors M1 and M2. The motor M3 includes a stator 50 and a rotor 52 concentrically surrounding the common axis 22. The rotor 52 is coupled to a hollow shaft 54 that extends upwardly to couple with the housing 55 of the inner link L3. The shaft 54 is located concentrically inwardly of the shafts 34, 44 of the motors M1 and M2 and rotates with the rotor 52.

The motor M4 includes a stator 60 and a rotor 62, also concentrically surrounding the common axis 22 and located outwardly of the motor M3. The rotor of the motor M4 is coupled to a shaft 64, which may or may not be hollow, that extends upwardly to couple with the pulley d5. The shaft 64 is located concentrically inwardly of the shafts 34, 44, 54 of the motors M1, M2, and M3 and rotates with the rotor 62. A hollow shaft is useful to contain power or signal cabling to the end effectors, if desired.

As noted above a suitable housing, such as housing 800H, is provided surrounding the stators of the motors. Preferably the motors M1 and M2 are provided as one module 82, and the motors M3 and M4 are provided as a second module 84. The motors are arranged in a back-to-back configuration, in which the end shafts of the motor modules are oriented in opposite directions when the motors are assembled into a two-module unit. Vacuum isolation barriers 86 (similar to barrier 830 described above), such as thin wall cylinders, are provided between the rotors 32, 42, 52, 62 and stators 30, 40, 50, 60, so that the stators are in an atmospheric environment or any other suitable environment isolated from an environment in which the transfer arms 904A, 904B operate.

Figure 10:
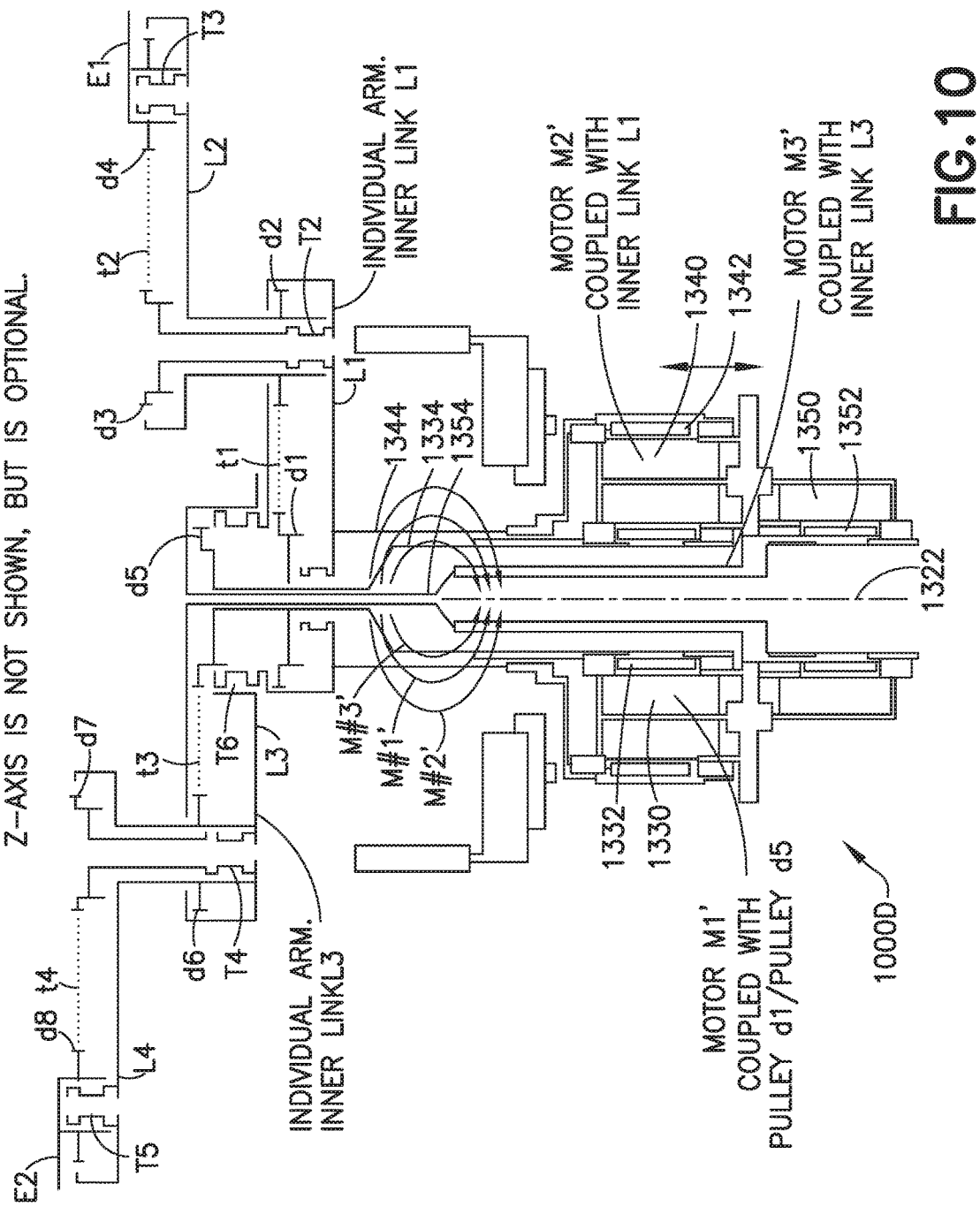
FIG. 10 is a schematic illustration of a transfer robot in accordance with aspects of the disclosed embodiment.

In other aspects the extension and rotation of the transfer arms may be coupled in any suitable manner such as that illustrated in FIG. 10. For example, FIG. 10 illustrates a three axis drive system 1000D having three motors M1', M2', M3' coupled to respective drive shafts 1344, 1334, 1354. In this embodiment, the end effector mounting flanges E1, E2 are oriented in the same direction. The links L1 through L4, E1, E2, and the joints T1 through T6 are embodied with the same pulleys d1 through d8 and belts t1 through t4 as described above, and the same reference designations are, accordingly, used for these elements. The pulleys d1 and d5 are, however, coupled on a single shaft to a motor M1'. Thus, rotation of the motor M1' results in rotation of both pulleys d1 and d5 simultaneously. A motor M2' is coupled with the inner link L1, and a motor M3' is coupled with the inner link L3. Thus, the inner links L1 and L3 are independently actuatable to extend and retract the end effector mounting flanges E1 and E2 respectively.

In one aspect, the ratio of the diameters of the pulleys d1:d2 and d5:d6 is 2:1. The ratio of the diameters of the pulleys d3:d4 and d7:d8 is 1:2. In other aspects the pulleys may have any suitable drive ratios. As an example of the three motor configuration to extend the end effector mounting flange E1, the motor M2' connected to the inner link L1 is actuated to rotate counterclockwise, while the motors M1' and M3' are maintained in a standfast mode. Retraction of the end effector mounting flange E1 is caused by rotation of the motor M2' clockwise. Similarly, to extend the end effector mounting flange E2, the motor M3' connected to the inner link L3 is actuated to rotate clockwise, while the motors M1' and M2' maintain a standfast mode. To change the orientation of the end effectors, all three motors are actuated. Rotation of all three motors counterclockwise causes both arms and the end effectors to rotate counterclockwise. Similarly, rotation of all three motors clockwise causes both arms and the end effectors to rotate clockwise. Note that rotation of the motor M1' alone would also cause extension or retraction of the end effectors. Thus, to change the orientation of the end effectors without extension or retraction thereof requires actuation of all three motors.

Still referring to FIG. 10, the motor M1' includes a stator 1330 and a rotor 1332 concentrically surrounding the central axis 1322 (substantially similar to axis 22 described above) of the drive shaft column. The rotor 1332 is coupled to a hollow shaft 1334 that extends upwardly to couple with the pulleys d1 and d5. The motor M2' includes a stator 1340 and a rotor 1342 concentrically surrounding the central axis 1322 of the column and the motor M1'. The rotor 1342 of the motor M2' is coupled to a hollow shaft 1344 located concentrically outwardly of the shaft 1334 of the motor M1' to couple with the inner link L1. The motor M3' is located below the motors M1' and M2' but in other aspects may be located above the motors M1', M2'. The motor M3' includes a stator 1350 and a rotor 1352 concentrically surrounding the central axis 1322 of the column. The rotor 1352 is coupled to a hollow shaft 1354 that extends upwardly to couple with the inner link L3. The shaft 1354 is located concentrically inwardly of the shafts 1334, 1344 of the motors M1' and M2'.

In the above three-degree-of-freedom embodiment, the end effector mounting flanges are oriented in the same direction. The end effector mounting flanges may also be oriented to face in the opposite directions or at an acute angle to relative to each other as described in U.S. Pat. No. 7,891,935 previously incorporated herein by reference.

Figure 11:
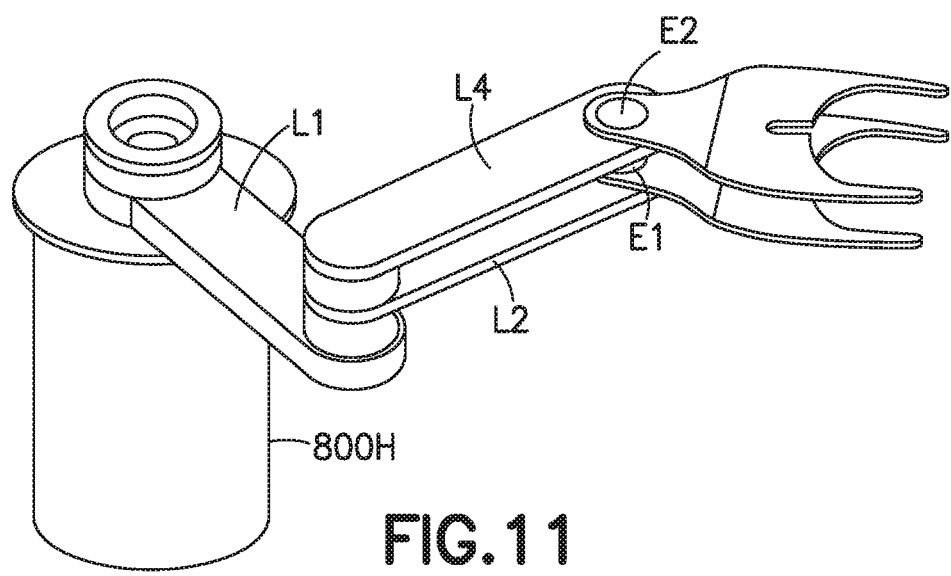
FIG. 11 is a schematic illustration of a transfer robot in accordance with aspects of the disclosed embodiment.

Referring to FIG. 11, other motor and arm combinations are possible in accordance with the aspects of the disclosed embodiment. For example, a three axis motor arrangement (which may be substantially similar to either motor arrangement illustrated in FIGS. 8 and 9 or a combination thereof) may be provided for driving two forearm links L2, L4 mounted to a single upper arm link L1 in any suitable manner (such as with the belt and pulley systems described above with respect to FIG. 9).

Figure 12A:
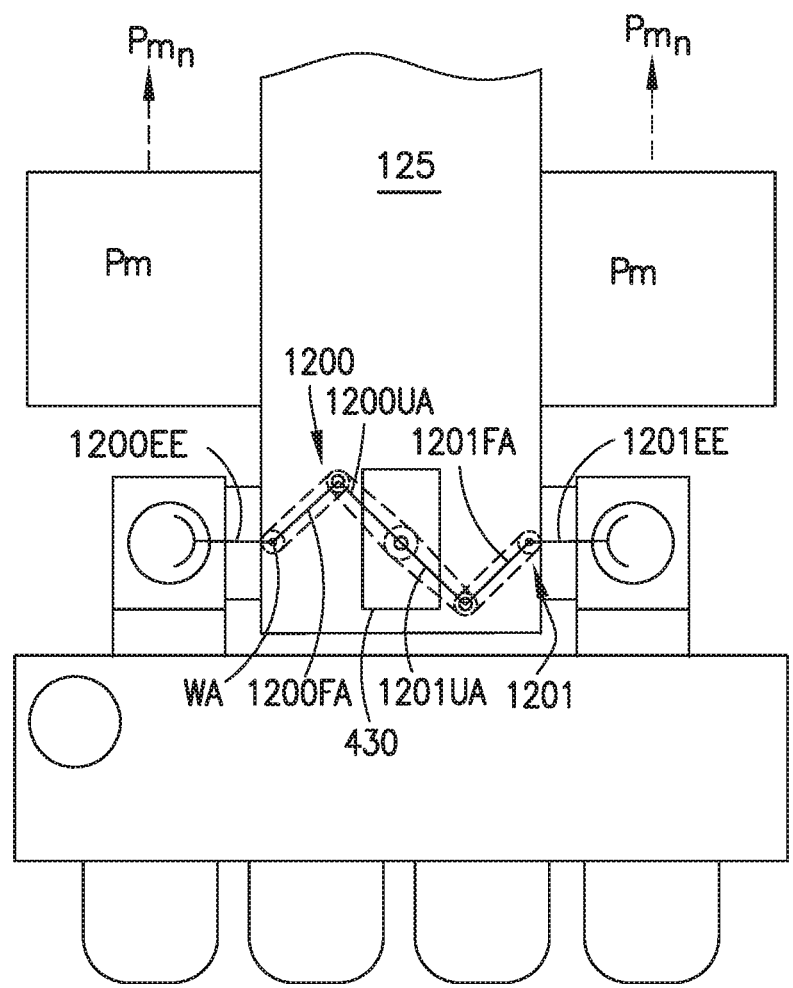
FIGS. 12A and 12B illustrate transfer robots in accordance with aspects of the disclosed embodiment.

Referring also to FIG. 12A a two axis motor arrangement (which may be substantially similar to either motor arrangement illustrated in FIGS. 8 and 9 or a combination thereof) may be provided for driving a dual opposing SCARA arm 1200, 1201 arrangement where each arm 1200, 1201 is driven in opposite directions in any suitable manner so that each arm is extended and retracted substantially simultaneously with the other arm (e.g. via a single drive axis). For example, a first or common drive axis may be coupled to both forearms 1200FA, 1201FA (in any suitable manner such as by belts and pulleys) for effecting the opposite substantially simultaneous extension of the arms 1200, 1201 while a second drive axis may be connected to the upper arms 1200UA, 1201UA in any suitable manner (e.g. such as directly to a drive shaft of the motor or through belts and pulleys) and used alone or in combination with the common drive axis to rotate the arms 1200, 1201 as a unit to, e.g., transfer substrates from one lateral side of the transport chamber 125 to the other lateral side. As may be realized in this aspect the end effectors may be slaved to a respective upper arm so as to remain aligned with an axis of extension/retraction of the arm 1200, 1201. In this aspect the forearms 1200FA, 1201FA may be offset (e.g. spaced apart) along the Z-axis (e.g. arranged at different heights) so that the arms 1200, 1201 can be retracted without interfering with one another. In other aspects additional drive axes may be added for driving the end effector(s) disposed on each arm 1200, 1201. For example, arm 1200 may have more than one end effector 1200EE arranged in a stacked configuration where each end effector 1200EE is independently rotatable about a wrist axis WA of arm 1200 for allowing fast swapping of substrates. Similarly arm 1201 may have more than one end effector 1201EE arranged in a stacked configuration where each end effector 1201EE is independently rotatable about a wrist axis WA of arm 1201 for allowing fast swapping of substrates. In other aspects each of the end effectors EEX may be arranged to hold substrates along a linear axis (see FIG. 12C) such that the end effectors EEX for each arm 1200, 1201 may be rotated by a common drive axis to effect the fast swapping of substrates with each arm 1200, 1201.

Figure 12B:
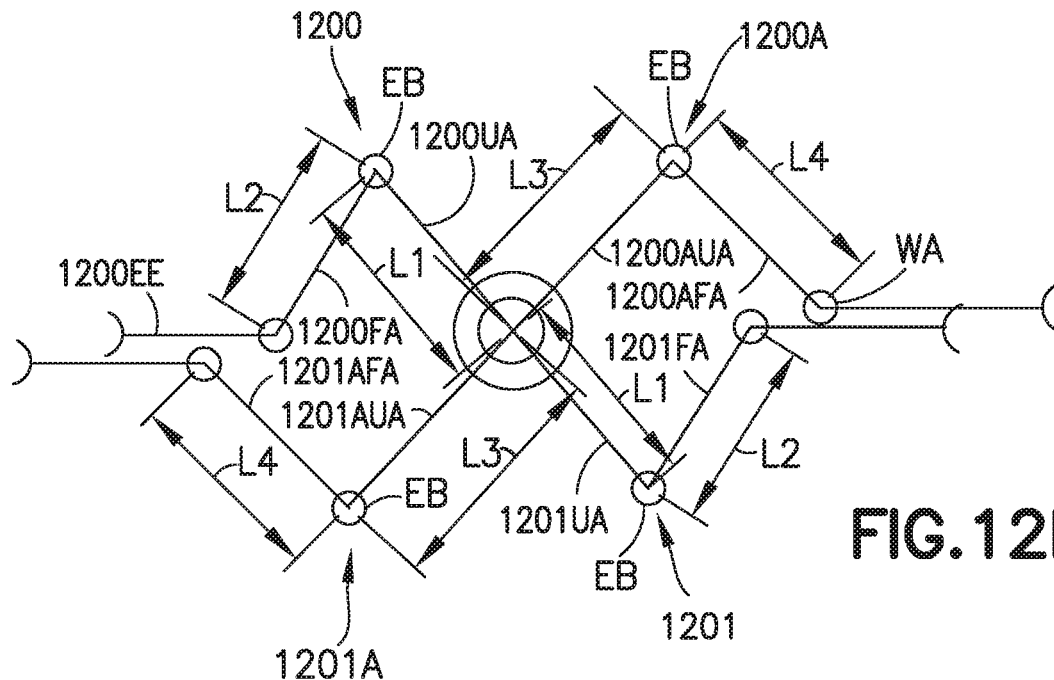
Figure 12C:
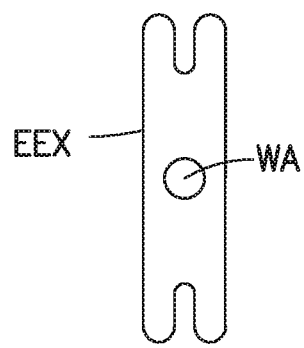
FIG. 12C illustrates a portion of a transfer robot in accordance with aspects of the disclosed embodiment.

FIG. 12B illustrates an arm arrangement similar to that described above however, in this aspect a tri-axial drive (which may be substantially similar to either motor arrangement illustrated in FIGS. 8 and 9 or a combination thereof) may be provided to drive a four arm 1200, 1201, 1200A, 1201A arrangement such that extension/retraction of arm 1200 may be linked with the extension/retraction of arm 1201 and the extension/retraction of arm 1200A may be linked with the extension/retraction of arm 1201A each in a manner substantially similar to that described above with respect to FIG. 12A. In other aspects extension/retraction of arm 1200 may be linked with the extension/retraction of arm 1200A and the extension/retraction of arm 1201 may be linked with the extension/retraction of arm 1201A. Here the forearm links 1200FA, 1201FA may be coupled to a first common drive axis such that the arms are extended/retracted substantially simultaneously in opposite directions (as described above such that the end effectors are slaved to follow an axis of extension/retraction of the respective arm). Likewise forearm links 1200AFA, 1201AFA may be coupled to a second common axis such that the arms are extended/retracted substantially simultaneously in opposite directions (as described above such that the end effectors are slaved to follow an axis of extension/retraction of the respective arm). A third drive axis may be coupled to the upper arms 1200UA, 1200AUA, 1201UA, 1201AUA in any suitable manner (such as described above) for rotating the arms 1200, 1201, 1200A, 1201A (in conjunction with rotation of the first and/or second drive axes) as a unit to, e.g., transfer substrates from one lateral side of the transport chamber 125 to the other lateral side. As may be realized, the arm link lengths may vary between arms 1200, 1200A, 1201A, 1201AFA so that each arm may operate substantially without interference from other ones of the arms. For example, arm 1200 may have an upper arm with a length L1 and a forearm with a length L2 while arm 1200A may have an upper arm with a length L3 and a forearm with a length of L4. This allows arm 1200 and 1200A to retract without the elbows EB of the arms 1200, 1200A interfering with one another. Similarly arm 1201 may have an upper arm with a length L1 and a forearm with a length L2 while arm 1201A may have an upper arm with a length L3 and a forearm with a length of L4 so that arms 1201, 1201A can be retracted without the elbows EB of the arms 1201, 1201A interfering with one another. It is noted that L1 may be less than L3 (or vice versa) and L2 may be less than L4 (or vice versa). In a manner substantially similar to that described above, in other aspects additional drive axes may be added for driving the end effector(s) disposed on each arm 1200, 1201, 1200A, 1201A. For example, arms 1200, 1201, 1200A, 1201A may have more than one end effector 1200EE arranged in a stacked configuration where each end effector 1200EE is independently rotatable about a wrist axis WA of a respective arm 1200, 1201, 1200A, 1201A for allowing fast swapping of substrates. In other aspects end effector EEX may be rotatably coupled to a wrist axis of a respective arm 1200, 1201, 1200A, 1201A such that the end effectors EEX for each arm pair 1200, 1201 and 1200A, 1201A may be rotated by a common drive axis to effect the fast swapping of substrates with each arm 1200, 1201. For example, a four axis drive may be employed where one drive axis is coupled to the upper arms 1200UA, 1201UA, 1200AUA, 1201AUA, one drive axis is coupled to forearms 1200FA, 1201FA, one drive axis is coupled to forearms 1200AFA, 1201AFA and a common drive axis is coupled to the end effectors 1200EE, EEX for each arm 1200, 1200A, 1201, 1201A. In other aspects one or more of the end effectors for one or more of the arms 1200, 1201, 1200A, 1201A may be rotatable independent of other ones of the end effectors of another of the other arms 1200, 1201, 1200A, 1201A.

As may be realized, power and signal cables and/or cooling-vent lines (not shown) may be introduced through suitably sealed openings 90 (see also FIG. 8) in the housing 800H. In other aspects power and control for the motors and sensors may be provided through inductive power couplings, charging stations or other suitable wireless communication devices. As noted above, the motor control amplifiers (or other suitable control electronics) may be distributed to simplify the electrical connectivity system. For example, in one aspect FireWire or EtherCat based topologies could be employed.

It is noted that the slot valves SV and substrate holding stations may be arranged depending on the configuration of the one or more transfer robot 704A, 704B. For example, referring again to FIGS. 3A, 3B and FIG. 7 where the end effectors EE of the transfer robots 704A, 704B (this includes the case where the transfer robots include more than one transfer arm on a single spindle such as described above with respect to e.g. FIGS. 9 and 10) are located in substantially the same horizontal plane, and with substantially no independent Z-axis movement, the slot valves SV may be located in a common horizontal plane (see plane PL1 in FIG. 4A) so that each end effector can pass through each slot valve. As may be realized, because the end effectors EE and slot valves SV are in a common plane the wrist of the transfer arms 450, 451 may pass through the slot valves SV. As may also be realized, because the end effectors EE are in a common plane suitable interlocks (mechanical and/or through the controller), such as described above, may be employed to substantially prevent operation of one arm from interfering with the operation of the other arm. Where two or more arms are utilized (whether the arms are on different spindles as shown in FIG. 7 or on a common spindle as shown in FIGS. 9 and 10) the end effectors EE may be placed on a common plane by inverting the position of the forearm FA and end effector EE. For example, as can be seen in FIG. 7, arm 451 includes upper arm UA, forearm FA and end effector EE. The end effector EE is located above (the terms above and below are used for exemplary purposes only and in other aspects any suitable spatial terms may be used) the forearm FA. The arm 450 includes upper arm UA, forearm FA1 and end effector EE1. The end effector EE1 is disposed below the forearm FA1 so that the end effector EE1 is substantially on the same horizontal plane as the end effector EE and is arranged in an opposing relationship with end effector EE1.

Figure 13:
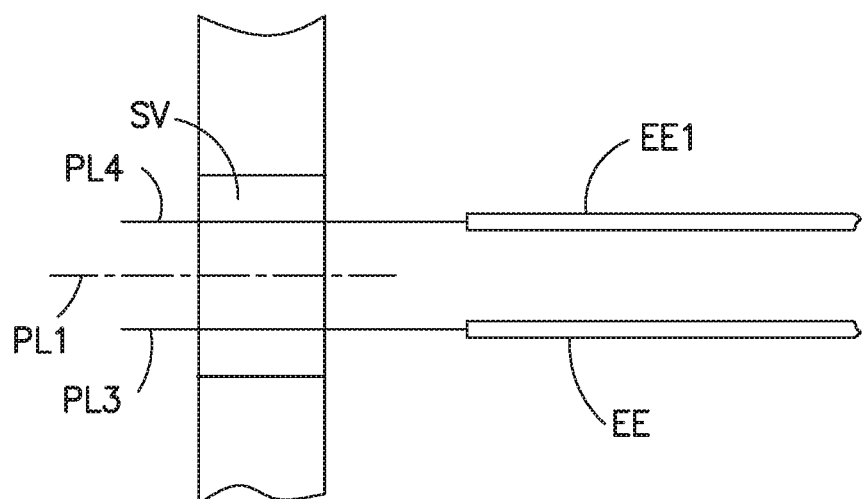
FIG. 13 is a schematic illustration of a portion of a substrate processing apparatus in accordance with aspects of the disclosed embodiment.

Referring also to FIG. 13, where the end effectors EE of the transfer robots 704A, 704B (this includes the case where the transfer robots include more than one transfer arm on a single spindle such as described above with respect to e.g. FIGS. 9 and 10) are located in different vertically stacked horizontal planes PL3, PL4, and with substantially no independent Z-axis movement, the slot valves SV may still be located in a common horizontal plane (see plane PL1 in FIG. 4A) so that each end effector can pass through each slot valve. In this aspect, the planes PL3 and PL4 may be arranged or otherwise vertically spaced such that the end effectors EE, EE1 carrying substrates can pass through the slot valves located in plane PL1. As may be realized, in this aspect the wrist of the arms 450, 451 may not pass through the slot valve SV. As may also be realized, because the end effectors EE are in closely spaced vertical planes PL3, PL4 suitable interlocks (mechanical and/or through the controller), such as described above, may be employed to substantially prevent operation of one arm from interfering with the operation of the other arm.

It is noted that, in one aspect, where the end effectors EE, EE1 are located substantially on the same plane PL1 and/or or in closely spaced vertical planes PL3, PL4 each of the transfer arms 450, 451 (located on different spindles as shown in FIG. 7) may not be able to reach substrate holding stations (such as load locks 102A-102D, 202A, 202B) located on the ends 100E1, 100E2 (FIGS. 1 and 2) of the transport chamber 125. As such, the location of the substrate holding stations may be limited to the lateral sides of the transport chamber 125 as shown in FIGS. 3A and 3B. However, in other aspects the length of one or more of the transfer arms 450, 451 and/or the width of the transport chamber 125 may be such that one arm is able to reach around the other arm for placing substrates into the substrate holding stations located at the ends of the transport chamber 125.

Still referring to FIG. 7, in another aspect of the disclosed embodiment, with substantially no independent Z-axis movement the end effectors EE, EE1 of the arms 450, 451 may be located on separate vertically stacked planes PL1, PL2 such that the wrist of each arm 450, 451 is able to pass through a slot valve. In this aspect the slot valves may be located in planes PL1, PL2 (see FIG. 4A) such that the end effector arm 450 (located in plane PL2) can access slot valves located in plane PL2 and the end effector arm 451 (located in plane PL1) can access slot valves located in plane PL1. It is noted that in the case of tandem process modules, such as process modules 130T, the tandem process module 130T may have separate processing chambers corresponding to each of the planes PL1, PL2 so that substrates in each of the separate processing chambers can be processed independent of a status of the other processing chamber in the tandem processing module.

As noted above, the telescoping linear traversing mechanism 400 may include a Z-axis lift drive 401 (FIG. 4A) which allows movement of the telescoping linear traversing mechanism 400 and the transfer arms carried thereon to move in the direction of arrow 499. As may be realized, where the Z-axis lift drive 401 is employed the end effectors EE, EE1 may be located in different planes PL1, PL2, PL3, PL4 and still be capable of accessing slot valves SV located in a single horizontal plane. For example, an end effector EE on one plane may be aligned with plane PL2 with the Z-axis lift drive 401 and extended through the slot valve SV (on e.g. plane PL2) for picking/placing a substrate. The end effector EE may be retracted from the slot valve SV and the Z-axis lift drive 401 may move the telescoping linear traversing mechanism 400 in the direction of arrow 499 to align the another end effector EE1 with the slot valve SV on, e.g. plane PL2. The end effector EE1 may then be extended through the slot valve SV for picking/placing a substrate. As may be realized, the interlocks mentioned above may be employed to prevent the operation of one arm from interfering with the operation of another arm during the pick/place operations.

In other aspects, the telescoping linear traversing mechanism 400 may not have a Z-axis lift drive. Here each of the robot arm drives 501, 502, 800, 900D, 1000D may include respective Z-axis lift drives, substantially similar to drive 401, such that each arm can be independently moved in the direction of arrow 499 for aligning the end effectors with a plane of the slot valves (or where multiple arms are located on a common spindle the arms can be moved in the direction of arrow 499 as a unit).

Figure 14:
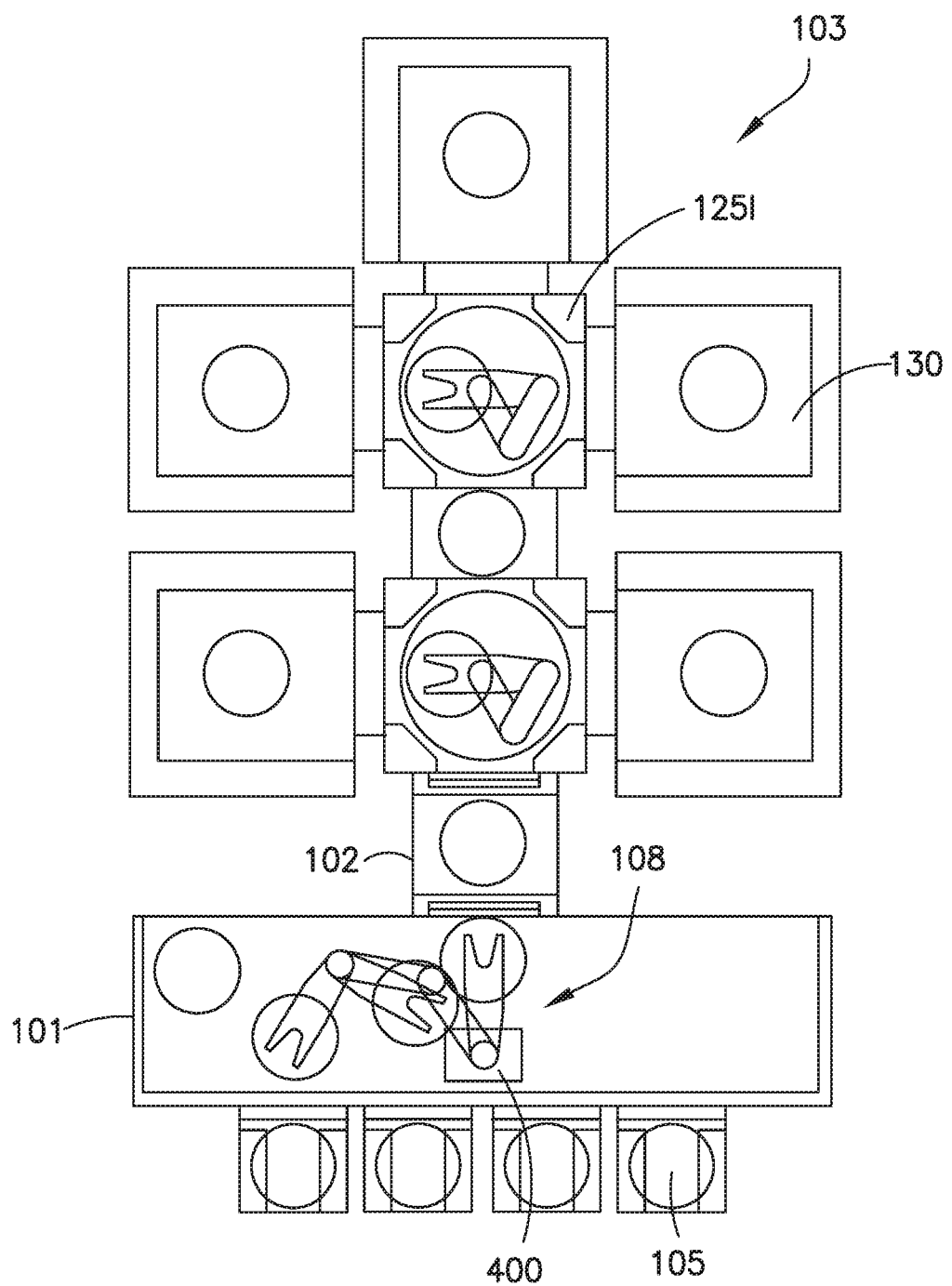
FIG. 14 is a schematic illustration of a substrate processing apparatus in accordance with aspects of the disclosed embodiment.

Referring now to FIG. 14, as noted above, the atmospheric front end 101 may include a transport robot 108 having a telescoping linear traversing mechanism 400 (which includes one or more of the features described above). In a manner similar to that described above one or more transfer arms may be mounted on the linear traversing mechanism 400 for transferring substrate between the load lock 200 and the load ports 105. In one aspect the transport robot 108 may be mounted on a linear track 493 as described above with respect to FIGS. 4G-4J. In this aspect the front end is communicably connected to a vacuum back end 103 that includes individual transfer chambers 125I (each having a transfer arm therein) that are communicably coupled to one another to form a transport tunnel having any suitable length such as described in U.S. Pat. No. 7,959,403 issued Jun. 14, 2011 the disclosure of which was previously incorporated herein by reference in its entirety. In other aspects the vacuum back end 103 may have any suitable configuration such as those described above.

In accordance with one or more aspects of the disclosed embodiment a semiconductor processing apparatus is provided. The semiconductor processing apparatus includes a frame forming a sealable chamber having a longitudinal axis and lateral sides astride the longitudinal axis, the sealable chamber being configured to hold a sealed environment therein, at least one transport module mounted to the sealable chamber and having a telescoping carriage being configured so that the telescoping carriage is linearly movable relative to another portion of the transport module where the telescoping carriage and the other portion define a telescoping motion along the longitudinal axis, and at least one transfer robot mounted to the carriage, each of the at least one transfer robot having at least one transfer arm configured for holding a workpiece thereon.

In accordance with one or more aspects of the disclosed embodiment a telescoping travel path of the telescoping carriage crosses an axis of entry/exit through a transport chamber opening through which a substrate holding station is communicably coupled to the transport chamber.

In accordance with one or more aspects of the disclosed embodiment the at least one transport module is removable from the sealable chamber as a unit.

In accordance with one or more aspects of the disclosed embodiment the at least one transfer robot is configured so that the at least one transfer arm is rotatable relative to the telescoping carriage.

In accordance with one or more aspects of the disclosed embodiment the sealed environment is a vacuum environment and the at least one transfer robot includes a sealed drive section disposed within the vacuum environment.

In accordance with one or more aspects of the disclosed embodiment the transport module includes a base member to which the telescoping carriage is movably mounted, the base member being fixedly and stationarily mounted relative to the frame.

In accordance with one or more aspects of the disclosed embodiment the at least one transfer robot and telescoping carriage are configured so that positioning of the telescoping carriage within the sealable chamber is effected substantially independent of transfer arm positioning for picking and placing substrates.

In accordance with one or more aspects of the disclosed embodiment the semiconductor processing apparatus includes kinematic locating features configured to engage the telescoping carriage for positioning the telescoping carriage within the sealable chamber.

In accordance with one or more aspects of the disclosed embodiment the semiconductor processing apparatus includes a controller and one or more sensors connected to the controller, the one or more sensors being located and configured to sense the telescoping carriage within the sealable chamber and the controller being configured to determine a position of the telescoping carriage within the sealable chamber based on signals from the one or more sensors.

In accordance with one or more aspects of the disclosed embodiment the semiconductor processing apparatus includes a controller and one or more sensors connected to the controller, the one or more sensors being located and configured to sense a substrate within the sealable chamber that is carried by the at least one transfer robot and the controller being configured to effect automatic wafer centering during transport of the substrate by the at least one transfer robot.

In accordance with one or more aspects of the disclosed embodiment the telescoping carriage spans a width that extends from adjacent one lateral side of the sealable chamber to another lateral side of the sealable chamber.

In accordance with one or more aspects of the disclosed embodiment the at least one transport module includes two telescoping carriages arranged laterally side by side within the sealable chamber.

In accordance with one or more aspects of the disclosed embodiment the at least one transport module includes a multistage telescoping carriage having serially connected telescoping members and a drive system having drive motors distributed on respective telescoping members.

In accordance with one or more aspects of the disclosed embodiment the at least one transfer robot includes at least one SCARA arm, each of the at least one SCARA arm having one or more arm links.

In accordance with one or more aspects of the disclosed embodiment the at least one transfer robot includes two transfer robots each have a corresponding drive axis that are longitudinally arranged on the telescoping carriage.

In accordance with one or more aspects of the disclosed embodiment each of the two transfer robots includes a respective drive spindle where a transfer arm of a first one of the two transfer robots is mounted to a different drive spindle than a transfer arm of a second one of the two transfer robots.

In accordance with one or more aspects of the disclosed embodiment the sealable chamber includes slot valves where a longitudinal spacing between the two transfer robots is substantially equal to the longitudinal spacing between slot valves.

In accordance with one or more aspects of the disclosed embodiment the two transfer robots each have a corresponding drive axis that are longitudinally offset and spatially fixed relative to one another.

In accordance with one or more aspects of the disclosed embodiment the telescoping carriage includes a carriage frame and a robot support movably mounted to the carriage frame and one of the two transfer robots is mounted to the robot support so as to be longitudinally displaceable relative to the other one of the two transfer robots on the telescoping carriage.

In accordance with one or more aspects of the disclosed embodiment at least one of the two transfer robots includes multiple independently actuable end effectors configured for fast swapping substrates at a common substrate holding station communicably coupled to the sealable chamber.

In accordance with one or more aspects of the disclosed embodiment each of the two transfer robots includes at least one end effector, the at least one end effector of one of the two transfer robots being located in a different plane than the at least one end effector of the other of the two transfer robots.

In accordance with one or more aspects of the disclosed embodiment the at least one end effector of each of the two transfer robots are located one above the other in an opposing relationship.

In accordance with one or more aspects of the disclosed embodiment each of the two transfer robots includes at least one end effector, the at least one end effector of one of the two transfer robots being located in substantially the same plane as the at least one end effector of the other of the two transfer robots.

In accordance with one or more aspects of the disclosed embodiment the semiconductor processing apparatus includes a controller configured to provide interlocks such that operation of one of the two transfer arms does not interfere with operation of the other of the two transfer arms.

In accordance with one or more aspects of the disclosed embodiment at least one of the at least one transfer robot includes a Z-axis drive.

In accordance with one or more aspects of the disclosed embodiment each of the at least one transfer robot includes a Z-axis drive.

In accordance with one or more aspects of the disclosed embodiment the at least one transport module includes a common Z-axis drive.

In accordance with one or more aspects of the disclosed embodiment the at least one transport robot includes a drive section having a common drive spindle and multiple transport arms mounted to the common drive spindle.

In accordance with one or more aspects of the disclosed embodiment each of the multiple transport arms are independently operable.

In accordance with one or more aspects of the disclosed embodiment the multiple transport arms have at least one common drive axis.

In accordance with one or more aspects of the disclosed embodiment the sealable chamber includes slot valves forming sealable ports, the slot valves being arranged to communicably couple one or more of twin process modules and single process modules to the sealable chamber.

In accordance with one or more aspects of the disclosed embodiment the slot valves are arranged in one or more of a common horizontal plane, vertically spaced apart horizontal planes and a combination thereof.

In accordance with one or more aspects of the disclosed embodiment the slot valves are arranged to provide substrate entry at a longitudinal front of the sealable chamber and substrate exit at a longitudinal rear of the sealable chamber or substrate entry at a longitudinal rear of the sealable chamber and substrate exit at a longitudinal front of the sealable chamber.

In accordance with one or more aspects of the disclosed embodiment the slot valves are arranged to provide substrate entry or exit from the sealable chamber at a point disposed between longitudinal ends of the sealable chamber.

In accordance with one or more aspects of the disclosed embodiment the semiconductor processing apparatus includes an atmospheric module and a substrate transport tunnel that is separate and distinct from the sealable chamber, the substrate transport tunnel being communicably coupled to the sealable chamber to provide substrate passage from the sealable chamber to the atmospheric module through the substrate transport tunnel.

In accordance with one or more aspects of the disclosed embodiment the sealable chamber comprises at least two chamber modules communicably coupled to each other to allow substrate handoffs between the at least two chamber modules.

In accordance with one or more aspects of the disclosed embodiment a semiconductor processing apparatus is provided. The semiconductor processing apparatus includes a frame forming a sealable chamber having a longitudinal axis and lateral sides, the sealable chamber being configured to hold a sealed environment therein, at least one transport module mounted to the sealable chamber and having a telescoping carriage being configured so that the telescoping carriage is linearly movable relative to another portion of the transport module where the telescoping carriage and other portion define a telescoping motion along the longitudinal axis, and two transfer robots mounted to the telescoping carriage so that the two transfer robots both move with the telescoping carriage as a unit, each of the two transfer robots having at least one transfer arm configured for holding a substrate thereon and a drive section carried by the telescoping carriage.

In accordance with one or more aspects of the disclosed embodiment the sealed environment is a vacuum environment and the drive section is a sealed drive section disposed within the vacuum environment.

In accordance with one or more aspects of the disclosed embodiment the transport module includes a base member to which the telescoping carriage is movably mounted, the base member being fixedly and stationarily mounted relative to the frame.

In accordance with one or more aspects of the disclosed embodiment the two transfer robots and the telescoping carriage are configured so that positioning of the telescoping carriage within the sealable chamber is effected substantially independent of transfer arm positioning for picking and placing substrates.

In accordance with one or more aspects of the disclosed embodiment the semiconductor processing apparatus includes kinematic locating features configured to engage the telescoping carriage for positioning the telescoping carriage within the sealable chamber.

In accordance with one or more aspects of the disclosed embodiment the semiconductor processing apparatus includes a controller and one or more sensors connected to the controller, the one or more sensors being located and configured to sense the telescoping carriage within the sealable chamber and the controller being configured to determine a position of the telescoping carriage within the sealable chamber based on signals from the one or more sensors.

In accordance with one or more aspects of the disclosed embodiment the semiconductor processing apparatus includes a controller and one or more sensors connected to the controller, the one or more sensors being located and configured to sense a substrate within the sealable chamber carried by each of the two transfer robots and the controller being configured to effect automatic wafer centering during transport of the substrate by each of the two transfer robots.

In accordance with one or more aspects of the disclosed embodiment the telescoping carriage spans a width that extends from adjacent one lateral side of the sealable chamber to another lateral side of the sealable chamber.

In accordance with one or more aspects of the disclosed embodiment the at least one transport module comprises two telescoping carriages arranged laterally side by side within the sealable chamber.

In accordance with one or more aspects of the disclosed embodiment the at least one transport module comprises a multistage telescoping carriage having serially connected telescoping members and a drive system having drive motors distributed on respective telescoping members.

In accordance with one or more aspects of the disclosed embodiment each of the two transfer robots comprises at least one SCARA arm, each of the at least one SCARA arm having one or more arm links.

In accordance with one or more aspects of the disclosed embodiment the two transfer robots each have a corresponding drive axis that are longitudinally offset on the telescoping carriage.

In accordance with one or more aspects of the disclosed embodiment each of the two transfer robots includes a respective drive spindle where a transfer arm of a first one of the two transfer robots is mounted to a different drive spindle than a transfer arm of a second one of the two transfer robots.

In accordance with one or more aspects of the disclosed embodiment the sealable chamber includes slot valves where a longitudinal spacing between the two transfer robots is substantially equal to the longitudinal spacing between slot valves.

In accordance with one or more aspects of the disclosed embodiment the two transfer robots each have a corresponding drive axis that are longitudinally offset and spatially fixed relative to one another.

In accordance with one or more aspects of the disclosed embodiment the telescoping carriage includes a carriage frame and a robot support movably mounted to the carriage frame and one of the two transfer robots is mounted to the robot support so as to be longitudinally displaceable relative to the other one of the two transfer robots on the telescoping carriage.

In accordance with one or more aspects of the disclosed embodiment at least one of the two transfer robots includes multiple independently actuable end effectors configured for fast swapping substrates at a common substrate holding station communicably coupled to the sealable chamber.

In accordance with one or more aspects of the disclosed embodiment each of the two transfer robots includes at least one end effector, the at least one end effector of one of the two transfer robots being located in a different plane than the at least one end effector of the other of the two transfer robots.

In accordance with one or more aspects of the disclosed embodiment the at least one end effector of each of the two transfer robots are located one above the other in an opposing relationship.

In accordance with one or more aspects of the disclosed embodiment each of the two transfer robots includes at least one end effector, the at least one end effector of one of the two transfer robots being located in substantially the same plane as the at least one end effector of the other of the two transfer robots.

In accordance with one or more aspects of the disclosed embodiment the semiconductor processing apparatus includes a controller configured to provide interlocks such that operation of one of the two transfer arms does not interfere with operation of the other of the two transfer arms.

In accordance with one or more aspects of the disclosed embodiment each of the two transfer robots includes a Z-axis drive.

In accordance with one or more aspects of the disclosed embodiment the at least one transport module includes a common Z-axis drive.

In accordance with one or more aspects of the disclosed embodiment each of the two transport robots includes a drive section having a common drive spindle and multiple transport arms mounted to the common drive spindle.

In accordance with one or more aspects of the disclosed embodiment each of the multiple transport arms are independently operable.

In accordance with one or more aspects of the disclosed embodiment the multiple transport arms have at least one common drive axis.

In accordance with one or more aspects of the disclosed embodiment the sealable chamber includes slot valves forming sealable ports, the slot valves being arranged to communicably couple one or more of twin process modules and single process modules to the sealable chamber.

In accordance with one or more aspects of the disclosed embodiment the slot valves are arranged in one or more of a common horizontal plane, vertically spaced apart horizontal planes and a combination thereof.

In accordance with one or more aspects of the disclosed embodiment the slot valves are arranged to provide substrate entry at a longitudinal front of the sealable chamber and substrate exit at a longitudinal rear of the sealable chamber or substrate entry at a longitudinal rear of the sealable chamber and substrate exit at a longitudinal front of the sealable chamber.

In accordance with one or more aspects of the disclosed embodiment the slot valves are arranged to provide substrate entry or exit from the sealable chamber at a point disposed between longitudinal ends of the sealable chamber.

In accordance with one or more aspects of the disclosed embodiment the semiconductor processing apparatus includes an atmospheric module and a substrate transport tunnel that is separate and distinct from the sealable chamber, the substrate transport tunnel being communicably coupled to the sealable chamber to provide substrate passage from the sealable chamber to the atmospheric module through the substrate transport tunnel.

In accordance with one or more aspects of the disclosed embodiment the sealable chamber comprises at least two chamber modules communicably coupled to each other to allow substrate handoffs between the at least two chamber modules.

In accordance with one or more aspects of the disclosed embodiment a semiconductor processing apparatus is provided. The semiconductor processing apparatus includes a frame forming a sealable chamber having a longitudinal axis and lateral sides, the sealable chamber being configured to hold a vacuum environment therein, at least one transport module fixedly mounted to the sealable chamber and having a telescoping carriage being configured so that the telescoping carriage is linearly movable relative to another portion of the transport module where the telescoping carriage and other portion define a telescoping motion along the longitudinal axis, and at least one transfer robot mounted to the telescoping carriage, each of the at least one transfer robot having at least one transfer arm configured for holding a substrate thereon and a sealed drive section disposed within the vacuum where the sealed drive section includes power, data communication and cooling connections.

In accordance with one or more aspects of the disclosed embodiment a semiconductor processing apparatus is provided. The semiconductor processing apparatus includes a frame forming a chamber having a longitudinal axis, lateral sides astride the longitudinal axis and at least one load port, the chamber being configured to hold a controlled environment therein, a telescoping carriage disposed at least partly within the chamber and being configured so that the telescoping carriage is linearly movable relative to another portion of the chamber where the telescoping carriage and the other portion define a telescoping motion along the longitudinal axis, and at least one transfer robot mounted to the carriage, each of the at least one transfer robot having at least one transfer arm configured for holding a substrate thereon.

In accordance with one or more aspects of the disclosed embodiment the semiconductor processing apparatus further includes a Z-axis drive connected to the telescoping carriage and being configured to move the telescoping carriage in a direction substantially perpendicular to a direction of extension and retraction of the telescoping carriage.

In accordance with one or more aspects of the disclosed embodiment the semiconductor processing apparatus further includes a Z-axis drive mounted to the telescoping carriage and being configured to move the at least one transfer robot in a direction substantially perpendicular to a direction of extension and retraction of the telescoping carriage.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A semiconductor processing apparatus comprising:
   a frame forming a sealable chamber having a longitudinal axis and lateral sides astride the longitudinal axis, the sealable chamber being configured to hold a sealed environment therein, and having at least one transport chamber opening disposed on the lateral sides for coupling a substrate holding station to the sealable chamber with a pass-through axis passing through the lateral sides angled relative to the longitudinal axis;
   at least one transport module mounted to the sealable chamber and having a telescoping carriage being configured so that the telescoping carriage is linearly movable relative to another portion of the transport module where the telescoping carriage and the another portion define a telescoping motion along the longitudinal axis so that the telescoping motion telescopes, relative to each other, the telescoping carriage and the another portion in a telescoping direction oriented with the longitudinal axis and produces moves of the telescoping carriage along the longitudinal axis relative to the another portion of the at least one transport module; and
   at least one transfer robot mounted to the telescoping carriage, each of the at least one transfer robot having at least one transfer arm configured for holding a substrate thereon.

2. The semiconductor processing apparatus of claim 1, wherein a telescoping travel path of the telescoping carriage crosses an axis of entry/exit through the transport chamber opening through which the substrate holding station is communicably coupled to the transport chamber.

3. The semiconductor processing apparatus of claim 1, wherein the at least one transport module is removable from the sealable chamber as a unit.

4. The semiconductor processing apparatus of claim 1, wherein the at least one transfer robot is configured so that the at least one transfer arm is rotatable relative to the telescoping carriage.

5. The semiconductor processing apparatus of claim 1, wherein the sealed environment is a vacuum environment and the at least one transfer robot includes a sealed drive section disposed within the vacuum environment.

6. The semiconductor processing apparatus of claim 1, wherein the transport module includes a base member to which the telescoping carriage is movably mounted, the base member being fixedly and stationarily mounted relative to the frame.

7. The semiconductor processing apparatus of claim 1, wherein the at least one transfer robot and telescoping carriage are configured so that positioning of the telescoping carriage within the sealable chamber is effected substantially independent of positioning of the at least one transfer arm for picking and placing substrates.

8. The semiconductor processing apparatus of claim 1, the semiconductor processing apparatus further comprising kinematic locating features configured to engage the telescoping carriage for positioning the telescoping carriage within the sealable chamber.

9. The semiconductor processing apparatus of claim 1, the semiconductor processing apparatus further comprising a controller and one or more sensors connected to the controller, the one or more sensors being located and configured to sense the telescoping carriage within the sealable chamber and the controller being configured to determine a position of the telescoping carriage within the sealable chamber based on signals from the one or more sensors.

10. The semiconductor processing apparatus of claim 1, the semiconductor processing apparatus further comprising a controller and one or more sensors connected to the controller, the one or more sensors being located and configured to sense a substrate within the sealable chamber that is carried by the at least one transfer robot and the controller being configured to effect automatic wafer centering during transport of the substrate by the at least one transfer robot.

11. The semiconductor processing apparatus of claim 1, wherein the telescoping carriage spans a width that extends from adjacent one lateral side of the sealable chamber to another lateral side of the sealable chamber.

12. The semiconductor processing apparatus of claim 1, wherein the at least one transport module includes two telescoping carriages arranged laterally side by side within the sealable chamber.

13. The semiconductor processing apparatus of claim 1, wherein the at least one transport module includes a multi-stage telescoping carriage having serially connected telescoping members and a drive system having drive motors distributed on respective telescoping members.

14. The semiconductor processing apparatus of claim 1, wherein the at least one transfer robot includes at least one SCARA arm, each of the at least one SCARA arm having one or more arm links.

15. The semiconductor processing apparatus of claim 1, wherein at least one of the at least one transfer robot includes a Z-axis drive.

16. The semiconductor processing apparatus of claim 1, wherein each of the at least one transfer robot includes a Z-axis drive.

17. The semiconductor processing apparatus of claim 1, wherein the at least one transport module includes a common Z-axis drive.

18. The semiconductor processing apparatus of claim 1, wherein the at least one transport robot further comprising a drive section having a common drive spindle and multiple transport arms mounted to the common drive spindle.

19. The semiconductor processing apparatus of claim 1, wherein the sealable chamber includes slot valves forming sealable ports, the slot valves being arranged to communicably couple one or more of twin process modules and single process modules to the sealable chamber.

20. The semiconductor processing apparatus of claim 19, wherein the slot valves are arranged in one or more of a common horizontal plane, vertically spaced apart horizontal planes and a combination thereof.

21. The semiconductor processing apparatus of claim 19, wherein the slot valves are arranged to provide substrate entry at a longitudinal front of the sealable chamber and substrate exit at a longitudinal rear of the sealable chamber or substrate entry at a longitudinal rear of the sealable chamber and substrate exit at a longitudinal front of the sealable chamber.

22. The semiconductor processing apparatus of claim 19, wherein the slot valves are arranged to provide substrate entry or exit from the sealable chamber at a point disposed between longitudinal ends of the sealable chamber.

23. The semiconductor processing apparatus of claim 1, wherein the semiconductor processing apparatus further comprising an atmospheric module and a substrate transport tunnel that is separate and distinct from the sealable chamber, the substrate transport tunnel being communicably coupled to the sealable chamber to provide substrate passage from the sealable chamber to the atmospheric module through the substrate transport tunnel.

24. The semiconductor processing apparatus of claim 1, wherein the sealable chamber includes at least two chamber modules communicably coupled to each other to allow substrate handoffs between the at least two chamber modules.

25. A semiconductor processing apparatus comprising:
a frame forming a sealable chamber having a longitudinal axis and lateral sides, the sealable chamber being configured to hold a vacuum environment therein and having a pass-through axis passing through the lateral sides angled relative to the longitudinal axis,
at least one transport module fixedly mounted to the sealable chamber and having a telescoping carriage being configured so that the telescoping carriage is linearly movable relative to another portion of the transport module where the telescoping carriage and another portion define a telescoping motion along the longitudinal axis so that the telescoping motion telescopes, relative to each other, the telescoping carriage and the another portion in a telescoping direction oriented with the longitudinal axis and produces moves of the telescoping carriage along the longitudinal axis relative to the another portion of the at least one transport module, and
at least one transfer robot mounted to the telescoping carriage, each of the at least one transfer robot having at least one transfer arm configured for holding a substrate thereon and a sealed drive section disposed within the vacuum where the sealed drive section includes power, data communication and cooling connections.

26. A semiconductor processing apparatus comprising:
a frame forming a chamber having a longitudinal axis, lateral sides astride the longitudinal axis and at least one load port, the chamber being configured to hold a controlled environment therein and having a pass-through axis passing through the lateral sides angled relative to the longitudinal axis,
a telescoping carriage disposed at least partly within the chamber and being configured so that the telescoping carriage is linearly movable relative to another portion of the chamber where the telescoping carriage and the another portion define a telescoping motion along the longitudinal axis so that the telescoping motion telescopes, relative to each other, the telescoping carriage and the another portion in a telescoping direction oriented with the longitudinal axis and produces moves of the telescoping carriage along the longitudinal axis relative to the another portion of the at least one transport module, and at least one transfer robot mounted to the carriage, each of the at least one transfer robot having at least one transfer arm configured for holding a substrate thereon.

27. The semiconductor processing apparatus of claim 26, further comprising a Z-axis drive connected to the telescoping carriage and being configured to move the telescoping carriage in a direction substantially perpendicular to a direction of extension and retraction of the telescoping carriage.

28. The semiconductor processing apparatus of claim 26, further comprising a Z-axis drive mounted to the telescoping carriage and being configured to move the at least one transfer robot in a direction substantially perpendicular to a direction of extension and retraction of the telescoping carriage.

* * * * *